(12) United States Patent
Peter et al.

(10) Patent No.: US 11,381,111 B2
(45) Date of Patent: Jul. 5, 2022

(54) COMMUNICATING ACROSS GALVANIC ISOLATION

(71) Applicant: Power Integrations, Inc., San Jose, CA (US)

(72) Inventors: Matthias Peter, Orpund (CH); Jan Thalheim, Biel-Bienne (CH)

(73) Assignee: POWER INTEGRATIONS, INC., San Jose, CA (US)

(*) Notice: Subject to any disclaimer, the term of this patent is extended or adjusted under 35 U.S.C. 154(b) by 643 days.

(21) Appl. No.: 16/415,669

(22) Filed: May 17, 2019

(65) Prior Publication Data
US 2019/0342122 A1 Nov. 7, 2019

Related U.S. Application Data

(63) Continuation of application No. 15/209,585, filed on Jul. 13, 2016, now Pat. No. 10,326,306.

(30) Foreign Application Priority Data

Jul. 31, 2015 (EP) .................................. 15179318

(51) Int. Cl.
*H04L 25/02* (2006.01)
*H03F 3/45* (2006.01)
(Continued)

(52) U.S. Cl.
CPC .............. *H02J 50/10* (2016.02); *G05F 3/262* (2013.01); *G06F 1/26* (2013.01); *H02J 50/80* (2016.02);
(Continued)

(58) Field of Classification Search
None
See application file for complete search history.

(56) References Cited

U.S. PATENT DOCUMENTS

| 4,942,510 A | 7/1990 | Edwards |
| 8,976,561 B2 | 3/2015 | Balakrishnan et al. |

(Continued)

FOREIGN PATENT DOCUMENTS

| CN | 103733488 A | 4/2014 |
| CN | 103944360 A | 7/2014 |

(Continued)

OTHER PUBLICATIONS

"European Application No. 18213491.6, European Communication Pursuant to Article 94(3) EPC", dated Jan. 16, 2020, 5 pages.
(Continued)

*Primary Examiner* — Jared Fureman
*Assistant Examiner* — Aqeel H Bukhari
(74) *Attorney, Agent, or Firm* — Power Integrations, Inc.

(57) ABSTRACT

A power conversion system comprising a system controller configured to generate an input signal in response to a system input and a switch controller coupled to the system controller, the switch controller configured to control a power switch. The switch controller comprises a driver interface configured to receive the input signal that indicates whether the power switch should be ON or OFF, the driver interface further configured to transmit one or more current pulses across a galvanic isolation using an inductive coupling. The driver interface further comprises a first local power supply configured to increase an output voltage of the first local power supply when a transmission of current pulses is imminent.

23 Claims, 11 Drawing Sheets

(51) Int. Cl.

| | |
|---|---|
| *H03F 3/68* | (2006.01) |
| *H02M 1/08* | (2006.01) |
| *H03K 17/567* | (2006.01) |
| *H02J 50/10* | (2016.01) |
| *H02J 50/80* | (2016.01) |
| *G05F 3/26* | (2006.01) |
| *G06F 1/26* | (2006.01) |
| *H04B 5/00* | (2006.01) |
| *H01L 23/495* | (2006.01) |
| *H01L 23/00* | (2006.01) |
| *H01L 25/18* | (2006.01) |

(52) U.S. Cl.
CPC .......... *H02M 1/08* (2013.01); *H03F 3/45179* (2013.01); *H03F 3/68* (2013.01); *H03K 17/567* (2013.01); *H04L 25/0268* (2013.01); *H01L 23/49575* (2013.01); *H01L 24/06* (2013.01); *H01L 24/48* (2013.01); *H01L 25/18* (2013.01); *H01L 2224/04042* (2013.01); *H01L 2224/0603* (2013.01); *H01L 2224/48091* (2013.01); *H01L 2224/48245* (2013.01); *H01L 2224/48247* (2013.01); *H01L 2224/48257* (2013.01); *H01L 2224/49111* (2013.01); *H03F 2200/462* (2013.01); *H03F 2203/45288* (2013.01); *H04B 5/0093* (2013.01)

(56) References Cited

U.S. PATENT DOCUMENTS

| | | |
|---|---|---|
| 2008/0246108 A1 | 10/2008 | Sakurabayashi |
| 2009/0237040 A1 | 9/2009 | Wadhwa |
| 2011/0264945 A1 | 10/2011 | Tsai et al. |
| 2012/0272076 A1 | 10/2012 | Tsai et al. |
| 2013/0313910 A1 | 11/2013 | Sasaki |
| 2014/0145504 A1 | 5/2014 | Kayama |
| 2014/0306545 A1 | 10/2014 | Robertson et al. |
| 2015/0049833 A1 | 2/2015 | Noguchi et al. |
| 2015/0162272 A1 | 6/2015 | Balakrishnan |
| 2015/0200599 A1 | 7/2015 | Mao |
| 2016/0094141 A1 | 3/2016 | Petkov |

FOREIGN PATENT DOCUMENTS

| | | |
|---|---|---|
| CN | 104578453 A | 4/2015 |
| EP | 2774244 A1 | 9/2014 |
| EP | 3125065 B1 | 2/2017 |
| JP | H05-204476 A | 8/1993 |
| JP | 2000-122738 A | 4/2000 |
| WO | 2013021371 A1 | 2/2013 |

OTHER PUBLICATIONS

EiceDRIVER™, Final Data Sheet: 1ED020I12-F2-Single IGBT Driver IC (Rev. 2.0, Aug. 1, 2011), © 2011 Infineon Technologies AG, Munich, 28 pages.
European Patent Application No. 15179318.9—European Office Action, dated Jul. 4, 2017, 5 pages.
European Patent Application No. 1517931 8.9—European Office Action, dated Jun. 9, 2016, 8 pages.
European Patent Application No. 15179318.9—European Search Report, dated May 30, 2016, 6 pages.
European Patent Application No. 15179318.9—Partial European Search Report, dated Feb. 10, 2016, 8 pages.
European Patent Application No. 18213491.6-1220 European Office Action, dated Jun. 8, 2020, 5 pages.
Japanese Patent Application No. 2016-136267 Japanese Office Action, dated May 20, 2020, 4 pages.
Notice of Reasons for Refusal for Japanese Office Action, dated May 20, 2020, 4 pages.
English machine translation of Bibliographic data for JP2000122738, dated Jun. 16, 2020, 1 page.
English machine translation of Specification for JP2000122738, dated Jun. 16, 2020, 14 pages.
English machine translation of Claims for JP2000122738, dated Jun. 16, 2020, 3 pages.
English machine translation of Bibliographic data for JPH05204476(A), dated Jun. 16, 2020, 1 page.
English machine translation of Specification for JPH05204476(A), dated Jun. 16, 2020, 14 pages.
English machine translation of Claims for JPH05204476(A) dated Jun. 16, 2020, 3 pages.
"European Patent Application No. 18213491.6—Extended Search Report dated Feb. 11, 2018", 13 pages.
"European Patent Application No. 18213491.6—Extended Search Report dated Apr. 24, 2019", 13 pages.
"Chinese Patent Application No. 201610592879.2—First Office Action dated Aug. 26, 2019", 5 pages.
European Search Report, European Application No. 21174336.4, dated Oct. 15, 2021.

COMMUNICATING ACROSS GALVANIC ISOLATION

REFERENCE TO RELATED APPLICATIONS

This application is a continuation of U.S. patent application Ser. No. 15/209,585, filed on Jul. 13, 2016, now pending, which claims priority to European Patent (EP) Application No. 15179318.9, filed on Jul. 31, 2015. U.S. patent application Ser. No. 15/209,585 and EP Application No. 15179318.9 is hereby incorporated by reference in their entirety.

BACKGROUND

1. Field of the Invention

The present invention relates generally to communication between a transmitter and receiver across galvanic isolation using an inductive coupling, for example, in the context of a power supply architecture for communication between a galvanically-isolated transmitter and receiver.

2. Background

Many electrical devices include a communication system to send information between a transmitter and a receiver that are galvanically isolated and refer to different ground potentials. Examples include power converters, medical equipment, marine equipment, and the like.

One such communication system uses magnetically coupled wires to send information between a transmitter and a receiver. Otherwise also known as inductive coupling, a varying current flowing through a transmitting conductor induces a varying voltage across the ends of a receiving conductor. The coupling between the conductors can be strengthened in various ways. For example, the wires may be wound into coils with or without a magnetic core. Examples of inductive coupling include a transformer and a coupled inductor.

Despite the magnetically coupling of such conductors, the conductors can remain electrically isolated from each other so that a voltage difference can be applied without significant electrical conduction therebetween. However, so long as the magnetic coupling between the conductors is sufficiently strong, information can be conveyed across this electrical isolation.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

Figure 1:
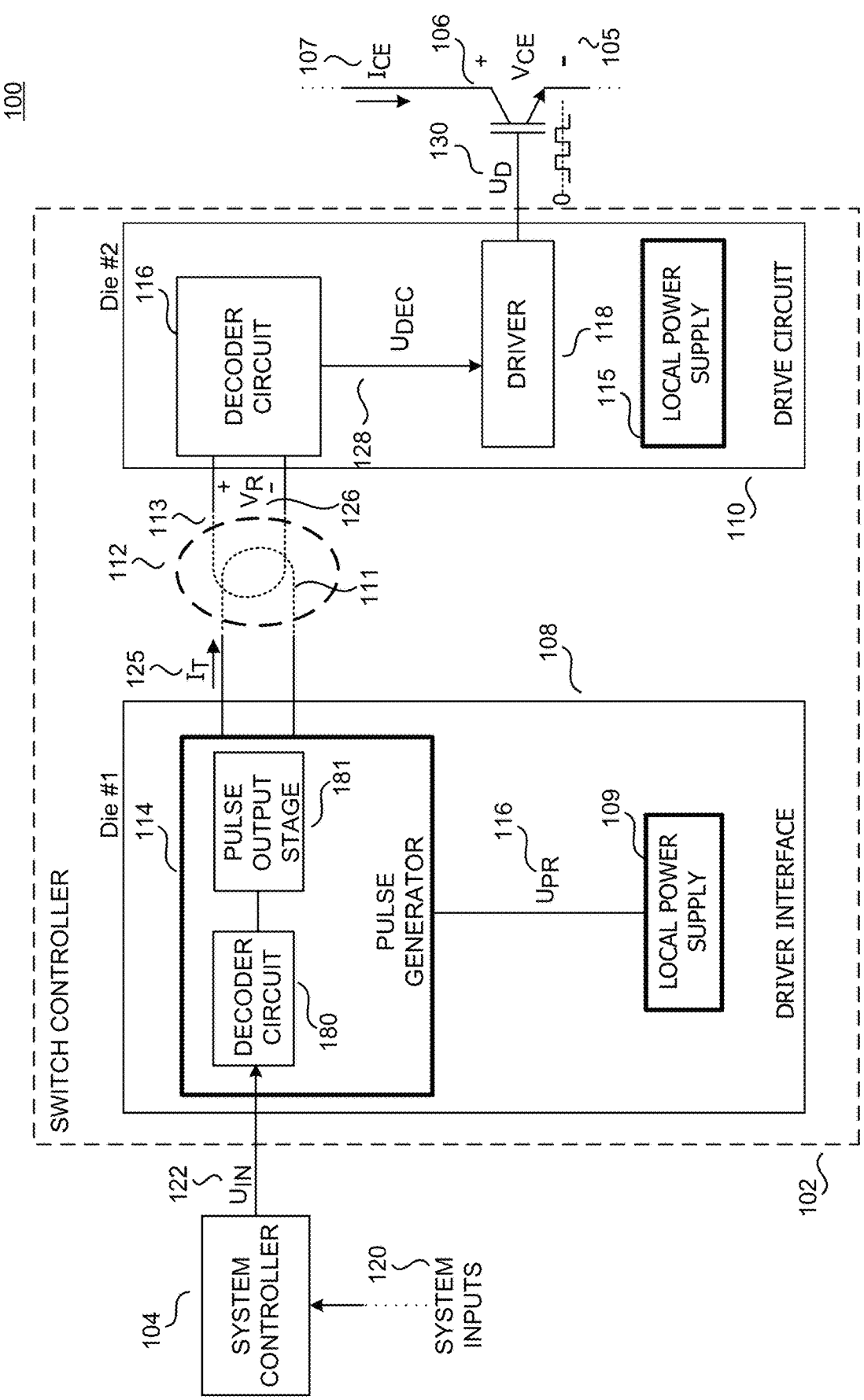
FIG. 1 illustrates one example of a switch controller that includes a communication link to communicate between a transmitter and a receiver, in accordance with teachings of the present invention.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

In the following description, numerous specific details are set forth in order to provide a thorough understanding of the present invention. It will be apparent, however, to one having ordinary skill in the art that the specific detail need not be employed to practice the present invention. In other instances, well-known materials or methods have not been described in detail in order to avoid obscuring the present invention.

Reference throughout this specification to "one embodiment", "an embodiment", "one example" or "an example" means that a particular feature, structure or characteristic described in connection with the embodiment or example is included in at least one embodiment of the present invention. Thus, appearances of the phrases "in one embodiment", "in an embodiment", "one example" or "an example" in various places throughout this specification are not necessarily all referring to the same embodiment or example. Furthermore, the particular features, structures or characteristics may be combined in any suitable combinations and/or subcombinations in one or more embodiments or examples. Particular features, structures or characteristics may be included in an integrated circuit, an electronic circuit, a combinational logic circuit, or other suitable components that provide the described functionality. In addition, it is appreciated that the figures provided herewith are for explanation purposes to persons ordinarily skilled in the art and that the drawings are not necessarily drawn to scale.

As mentioned above, electrical devices may include an inductive coupling to send information between a galvanically-isolated transmitter and receiver. A signal can be sent to a receiver by varying the current flowing through a transmitting conductor. The varying current induces a voltage across the ends of a receiving conductor. In some cases, the signal sent by the transmitter may be a current pulse waveform that induces a voltage pulse waveform at the receiver.

In some electrical devices, the conductors in the inductive coupling may only be weakly coupled in the sense that relatively large changes in current through the transmitting conductor produce relatively small changes in voltage at the receiving conductor. This is especially true in the case of inductive couplings that are formed at least in part from conductors such as a lead frames, top metallization layers of a semiconductor chip, bond wires, and the like. In particular, although such conductors are small in size, inexpensive, and can be disposed within a semiconductor package, they are usually formed with a small number of turns (one turn is typical) and generally do not include high magnetic permeability cores. For example, the transmitting and receiving conductors can be coils that have an inductance of 50 nH or less, e.g., 20 nH or less or even 10 nH or less. The amplitude swing in the receiving conductor is thus relatively small when compared to the rate of change of current through the transmitting conductor.

If the induced voltage in the receiving conductor is relatively small, it may be difficult to distinguish the induced voltage from noise. This is especially true in the context of noisy environments, such as in controllers for power switches where different portions of the controller are galvanically isolated from one another. In particular, the power switched by a power switch can be much larger than the power of a signal transmitted across an inductive coupling. For example, a power switch may switch 100's or even 1000's of volts whereas the received signals may be 100's of mV, 10's of mV, or even less. Distinguishing the signal voltage from noise under such conditions is generally difficult.

One approach to increase the magnitude of the received voltage is to increase the rate of change of the current through the transmitting conductor. For example, the transmitted signals can include pulses having durations of 10 nanoseconds or less, e.g., 5 nanoseconds or less. Further, the amplitude of the current swing associated with those pulses should be as high as possible.

However, the conduction of such current pulses through the transmitting conductor can lead to instability in the supply voltage. In this regard, in order to provide such current pulses, the power supply of the signal transmission circuitry must be able to transition from providing zero (or other steady state) current to providing a high current in short (e.g., nanosecond-scale) time frames. Although a sufficiently large bypass capacitor on the power supply could in theory damp the supply voltage changes that would result from such rapid changes in current demand, as a practical matter the size of such a bypass capacitor would be disadvantageously large. Space savings achieved by disposing the relatively weak inductive coupling inside the semiconductor package would be counterbalanced the space consumed by the large bypass capacitor—regardless of whether the bypass capacitor is external to the package or integrated into a semiconductor die.

Instability in the supply voltage can be problematic for several reasons that generally depend on the nature of the circuitry that is supplied by the voltage. For example, some digital circuitry has relatively small tolerances for variation in the supply voltage. As another example, transistors or other circuit elements may move out of their safe operating area if the supply voltage varies excessively.

To address these and other issues, the electronic devices described herein can include two power supplies. For example, in some implementations, a first of the power supplies can supply the majority of current to the transmitting conductor of a magnetic coupling across galvanic isolation. The first of the power supplies can also supply current to a second, local power supply. In turn, the local power supply can supply other circuitry that is on the same side of the galvanic isolation (i.e., referenced to the same potential) as the transmitting conductor and the first power supply. In operation, the local power supply can be more stable than the first power supply. This stability can help ensure proper operation and even, in some cases, protect the circuitry that is supplied by the local power supply from unsafe operating conditions.

In some implementations, the circuitry that is supplied by the local power supply includes pulse control circuitry for controlling the current pulses that are used to transmit information across the galvanic isolation to a receiving conductor of a magnetic coupling.

In some implementations, a plurality of local power supplies can be used to power multiple separate nets. For example, one local power supply can supply power to auxiliary driving circuits that cause and tolerate relatively large supply swings due to their large current requirements. Another local power supply can supply power to analog circuitry that requires lower supply swings. Yet another local power supply can supply power to digital circuitry that may tolerate relatively higher supply swings than analog circuitry. As a result, adequate dedicated supply swings may be achievable with a relatively low total supply bypass capacitance. This may allow the signal transmission and reception circuitry, as well as the magnetic coupling and multiple power supplies, to be disposed within a single semiconductor package without a large internal or external bypass capacitor.

In some implementations, the local power supply is isolated from the first power supply with a unidirectional current path that isolates the local power supply from relatively lower frequency pulses at a first power supply. For faster pulses, an RC circuit can isolate a local supply from the first power supply. The resistance of the RC circuit can be provided by active devices that adjust to the load conditions. The unidirectional current flow path allows current to flow from the first power supply to the local power supply, i.e., to supply power to the local power supply. However—depending on operating conditions—the current flow and supply of power are not continuous. In particular, the potential difference between the first power supply and the local power supplies may at times switch during operation. The unidirectionality of the current flow path prevents the first of the power supplies from drawing power from local power supply, e.g., while the first power supply is supplying current to the transmitting conductor of a magnetic coupling. This allows the provision of voltage by the local power supply to be more stable.

When supplying pulses to the transmitting conductor of a magnetic coupling, the current rises very fast (e.g. in in times of less than 10 ns, e.g., 5 ns). To reduce this current as quickly as possible back to approximately zero, a relatively large negative voltage should be applied across the transmitting conductor.

One example device that may benefit from these teachings is a switch controller that controls a power switch in a power conversion system. An example power switch is an insulated-gate bipolar transistor (IGBT). A switch controller for an IGBT or other power switch may include a driver interface and a drive circuit that are coupled to communicate through an inductive coupling that functions as a communication link. The driver interface may be on the primary side of the switch controller while the drive circuit may be on the secondary side. The inductive coupling functions as a communication link and bridges the galvanic isolation between primary and the secondary sides. The driver interface on the primary side may be powered by a local power supply or a plurality of local power supplies with separate digital, analog, and auxiliary driving circuitry. The driver interface may be coupled to receive an input signal, which provides information indicating the current state of the IGBT power switch or is transitioning between an ON-state or an OFF-state. The information in the input signal is then communicated to the drive circuit via the inductive coupling. In response to this information, the drive circuit then generates a drive signal which drives the switching of the power switch.

In some implementations, two-way communications across the galvanic isolation may be desirable. In such cases, both the primary side and the secondary side can each include both data transmission circuitry and data reception circuitry.

Further, both the primary side and the secondary side can both include one or more local power supplies. However when using a package without low impedance supply connections, short pulses can lead to large voltage drops and large overshoots from parasitic supply inductance. For example, the parasitic inductance of bond wire connections inherently produce large voltage drops and large voltage overshoots. These issues can limit the transmit amplitude and overshoots can endanger the safe operating conditions of the device.

In general, a single inductive coupling can act as a bidirectional communication link and carry information in both directions, i.e., from the primary side to the secondary side and from the secondary side to the primary side. However, this is not necessarily the case. In some implementations, multiple inductive couplings can be used.

In general, the primary and secondary side circuits (including, e.g., the driver interface and drive circuit) are implemented as integrated circuits (ICs). In some of the implementations described herein, the primary and secondary side integrated circuits—along with the inductive coupling—can be packaged in a single package. In this regard, integrated circuit packages generally inherently include one or more lead frames. A lead frame provides mechanical support for the die or dice that are packaged within the integrated circuit package. In general, the lead frame includes a die attach pad to which a semiconductor die may be attached. In addition, the lead frame generally also includes leads that serve as electrical connections to circuits external to the integrated circuit package. The lead frame is generally constructed from a flat sheet of metal. The flat sheet of metal may be stamped, etched, punched, etc., with a pattern, which defines the die attach pads and various leads of the lead frame.

FIG. 1 illustrates one example of a switch controller that includes a communication link to communicate between a transmitter and a receiver, in accordance with teachings of the present invention. System 100 includes a switch controller 102 that has a primary side and a secondary side that are galvanically isolated from one another. Switch controller 102 includes data transmission circuitry and data reception circuitry that communicate across the galvanic isolation using an inductive coupling. In some cases, only one of the primary side and the secondary side includes data transmission circuitry. In other cases, both the primary side and the secondary side each include data transmission circuitry and data reception circuitry. Further, each side in switch controller 102 that includes data transmission circuitry that can include a local power supply that supplies power to other circuitry on that side with a more stable source of power than the power supply which supplies the current that drives through the transmitting conductor of the inductive coupling to transmit information.

In the illustrated implementation, system 100 includes not only switch controller 102, but also a system controller 104 and a power switch 106. System controller 104 is a control device that is coupled to receive one or more system inputs 120 that represent information that can be used by system controller to generate a signal $U_{IN}$ 122 that indicates whether power switch 106 should be ON or OFF. In some implementations, system controller 104 is coupled to output a signal such as signal $U_{IN}$ 122 to a number of different switch controllers. System controller 104 can control multiple switch controllers in a variety of different contexts, including e.g., motor drives, power generation systems, power transmission systems, and power conditioning systems. Power switch 106 is illustrated as an IGBT but can be any power semiconductor switch, including, e.g., a power MOSFET, a power JFET, or the like.

Switch controller 102 includes a primary-side driver interface 108, a secondary-side drive circuit 110, and an inductive coupling 112 that forms a communication link that bridges the galvanic isolation between them.

Primary-side driver interface 108 is circuitry that is configured to interface controller 102 with system controller 104. Primary-side driver interface 108 is coupled to receive signal $U_{IN}$ 122 from system controller 104 and convey the information therein to secondary-side drive circuit 110.

Primary-side driver interface 108 includes pulse generation circuitry 114 and local power supply 109. Pulse generation circuitry 114 includes a decoder circuit 180 and a pulse output stage 181. Decoder circuit 180 decodes the information in signal $U_{IN}$ 122 for transmission by pulse output stage 181 to secondary-side drive circuit 110. Decoder circuit 180 also generates a pulse request signal $U_{PR}$ 116 that indicates to local power supply 109 that output of one or more current pulses by output stage 181 is imminent. Pulse output stage 181 outputs current pulses to the primary side conductive loop 111 of inductive coupling 112 in accordance with the information decoded from signal $U_{IN}$ 122 by decoder circuit 180.

Local power supply 109 is a power supply that supplies power to at least some of the circuitry in primary-side driver interface 108. The power supplied by local power supply 109 provides less voltage ripple than the power supply (not shown) that supplies the majority of the current in the current pulses output by pulse output stage 181 to the primary side conductive loop 111. The circuitry that is supplied by local power supply 109 can include pulse control circuitry in pulse output stage 181 for controlling the current pulses that are used to transmit information across the galvanic isolation.

Secondary-side drive circuit 110 includes a decoder circuit 116 and a power switch driver 118. Decoder circuit 116 is coupled to secondary side conductive loop 126 to receive and decode the voltages pulses induced in secondary side conductive loop 126 by the current pulses through primary side conductive loop 111. Power switch driver 118 is coupled to drive power switch 106 in accordance with the information decoded from the voltage pulses by decoder circuit 116. In some implementations, power switch driver 118 outputs a drive signal to the control terminal of power switch 106.

In the illustrated implementation, primary-side driver interface 108 communicates to the secondary-side drive circuit 110. Secondary-side drive circuit 110 includes a local power supply 115 and may also contain its own pulse generator circuit similar to the primary side driver interface 108. In some implementations, secondary-side drive circuit 110 does not include a local power supply 115 and a pulse generator circuit. However, in this illustrated implementation, local power supply 115 is coupled to supply power to a secondary-side pulse generator circuit (not shown) for communicating information from secondary-side drive circuit 110 to primary-side driver interface 108. Local power supply 115 provides a more stable voltage than the power supplied by the power supply (not shown) that supplies the majority of the current for the current pulses output to the secondary side conductive loop 113 for transmitting information from secondary-side drive circuit 110 to primary-side driver interface 108. The local power supply 115 receives a high input voltage and provides a stable voltage even during rapid changes in current. The circuitry that is supplied by local power supply 115 can also include pulse control circuitry for controlling the current pulses that are used to transmit information across the galvanic isolation.

Inductive coupling 112 includes a primary side conductive loop 111 and a secondary side conductive loop 126. Inductive coupling 112 forms a communication link across the galvanic isolation between the primary-side driver interface 108 and the secondary-side drive circuit 110. Loops 111, 113 can be magnetically coupled in a variety of different ways. For example, in some implementations, loops 111, 113 can be wound about a common high-magnetic-permeability core and form a transformer. However, in other implementations, loops 111, 113 do not share a common core. The strength of the magnetic coupling between loops 111, 113 is determined by several factors, including the nature of any core and surrounding medium, the geometry and disposition of loops 111, 113, and the number of windings in loops 111, 113. As discussed further below, in some implementations, loops 111, 113 can each be single loop inductors formed at least in part by the lead frame of a semiconductor chip package (e.g., FIG. 8) and have relatively small-inductances. For example, loops 111, 113 can have inductances of 50 nH or less or 20 nH or less.

FIG. 1 also illustrates:
a voltage $V_{CE}$ 105 that is arises between the main terminals (here, the collector and the emitter) of power switch 106,
a current $I_{CE}$ 107 that flows between the main terminals (here, the collector and the emitter) of power switch 106,
one or more system inputs 120 that represent information that can be used by system controller to generate a signal input signal $U_{IN}$ 122,
input signal $U_{IN}$ 122 that indicates whether power switch 106 should be ON or OFF,
transmit current $I_T$ 125 that is conducted through primary side conductive loop 111,
receiver voltage $V_R$ 126 that is induced in secondary side conductive loop 126 by changes in transmit current $I_T$ 125,
decoded signal $U_{DEC}$ 128 that is yielded by the decoding of receiver voltage $V_R$ 126 by decoder circuit 116, and
drive signal $U_D$ 130 that is output by driver 118 to drive power switch 106.

In operation, system controller 104 receives system inputs 120. System controller 104 determines whether the switch controller 102 should turn ON or turn OFF the power switch 106 based on system inputs 120 and generates an input signal $U_{IN}$ 122 that characterizes the results of that determination. Example system inputs 120 include the pulse width modulated (PWM) signal for a general purpose motor drive, a turn on and turn off sequence of a multi-level power converter, or a system fault turn-off request.

In the illustrated system 100, system controller 104 outputs input signal $U_{IN}$ 122 to switch controller 102. In some cases, input signal $U_{IN}$ 122 may be a rectangular pulse waveform that includes logic high and logic low sections of varying durations. For example, logic high values may indicate that power switch 106 is to be in the ON state. Logic low values may indicate that power switch 106 is to be in the OFF state. The durations of the logic high/logic values can correspond to the desired driving of power switch 106.

Primary-side driver interface 108 of switch controller 102 is coupled to receive input signal $U_{IN}$ 122. Primary-side driver interface 108 includes a decoder circuit 180 that decodes input signal $U_{IN}$ 122 for transmission of at least some of the information therein over inductive coupling 112. The primary-side driver interface 108 also includes pulse output stage 181 to generate the current pulses $I_T$ 125 that embody that information to be sent to the secondary-side drive circuit 110. For example, in some implementations, multiple current pulses can encode a single information state. The current for these current pulses is supplied by a first power supply such as an external power supply of primary-side driver interface 108, whereas at least some of the power used by output stage 181 to control these pulses is provided by local power supply 109.

Primary-side driver interface 108 transmits the current pulses to the secondary-side drive circuit 110 via the magnetically coupled loops 111, 113 of inductive coupling 112. Secondary-side drive circuit 110 is a drive circuit that drives the switching of power switch 106. In the illustrated example, the changing transmitter current $I_T$ 125 through primary side conductive loop 111 induces a voltage $V_R$ 126 in secondary side conductive loop 113. As such, the secondary-side drive circuit 110 receives information from primary-side driver interface 108. As discussed further, primary side conductive loop 111 and secondary side conductive loop 113 can in some implementations be formed using a lead frame within an integrated circuit package (FIG. 8) or the top metallization of silicon of an integrated circuit.

In the illustrated implementation, secondary-side drive circuit 110 includes decoder circuit 116, drive circuit power supply 115, and driver 118. Driver 118 outputs the drive signal $U_D$ 130. Drive signal $U_D$ 130 is coupled to be received at the control terminal of power switch 10 to control the switching of the power switch 106. In the illustrated implementation, power switch 106 is an IGBT and drive signal $U_D$ 130 is received at the gate-terminal of the IGBT 106. Decoder circuit 116 is coupled to receive the receiver signal $V_R$ 126 and determine whether the received signal $V_R$ 126 indicates that the power switch 106 should transition from an ON state to an OFF state or vice-versa. Decoder circuit 116 outputs decoded signal $U_{DEC}$ 128 that characterizes the results of this determination. In one example, decoder circuit 116 includes a pulse density determination circuit to differentiate the varying lengths of the multi-level state representation. Driver 118 is coupled to receive the decoded signal $U_{DEC}$ 128 and output the drive signal $U_D$ 130.

In some implementations, secondary-side drive circuit 110 will transmit information to primary-side driver interface 108. Examples of such information can include, e.g., error notifications, confirmation signals, and feedback information. In such cases, secondary-side drive circuit 110 drives current pulses through secondary side conductive loop 113. The changes in current through secondary side conductive loop 113 induces a voltage in primary side conductive loop 111. As such, the primary-side driver interface 108 receives information from secondary-side drive circuit 110.

Figure 2:
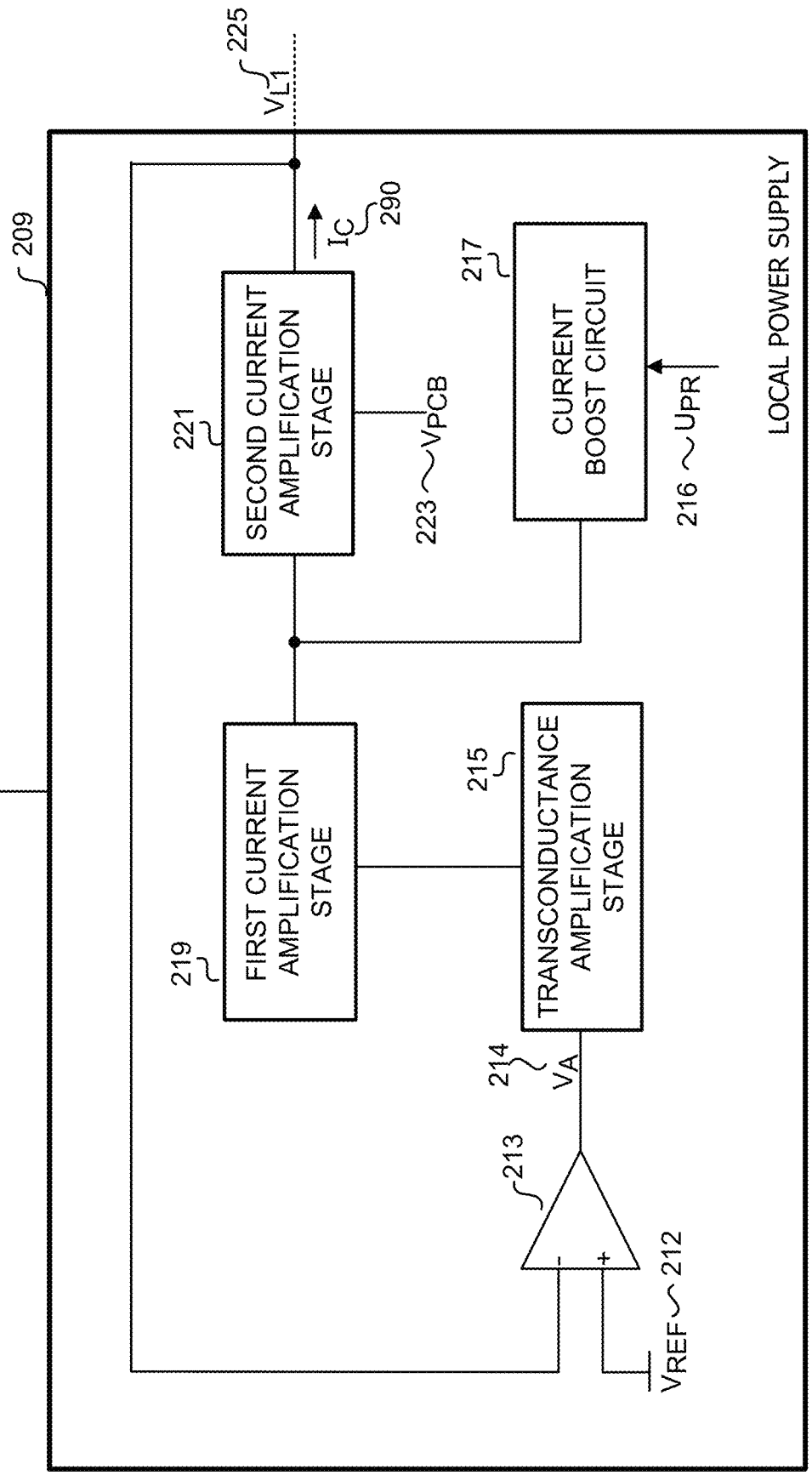
FIG. 2 illustrates one example of a driver interface power supply, in accordance with teachings of the present invention.

FIG. 2 illustrates one example of a driver interface power supply, in accordance with teachings of the present invention. In the illustrated implementation, local power supply 209 includes a coupling to a raw external voltage $V_{PCB}$ 223, as would be the case if local power supply 209 was located on the primary side of a switch controller (i.e., if local power supply 209 were acting as local power supply 109 in the context of switch controller 102 described in (FIG. 1)).

Local power supply 209 includes a differential voltage amplifier 213, a transconductance amplification stage 215, a current boost circuit 217, a first current amplification stage 219, and a second current amplification stage 221.

Differential voltage amplifier 213 includes an inverting input and a non-inverting input. The non-inverting input is coupled to a reference voltage $V_{REF}$ 212 that represents the desired voltage that is to be supplied by local power supply 209. The inverting input is coupled to the output of local power supply 209, namely, a supply voltage $V_{L1}$ 225. In one example, the reference voltage $V_{REF}$ 212 may be approximately 5 volts. Differential voltage amplifier 213 acts as an error amplifier and the error signal is an output voltage $V_A$ 214 that represents the difference between the desired output (i.e., reference voltage $V_{REF}$ 212) and the actual output (i.e., supply voltage $V_{L1}$ 225).

Transconductance amplification stage 215 is coupled to receive output voltage $V_A$ 214 and output a current that is representative of the magnitude of output voltage $V_A$ 214. The magnitude of the current output from transconductance amplification stage 215 is thus representative of the difference between the desired output (i.e., reference voltage $V_{REF}$ 212) and the actual output (i.e., supply voltage $V_{L1}$ 225).

First current amplification stage 219 is coupled to transconductance amplification stage 215 to receive the current that is representative of the difference between the desired output (i.e., reference voltage $V_{REF}$ 212) and the actual output (i.e., supply voltage $V_{L1}$ 225). The first current amplification stage 219 is configured to amplify this current, for example, using one or more current mirrors, and output yet another current that is representative of the difference between the desired output (i.e., reference voltage $V_{REF}$ 212) and the actual output (i.e., supply voltage $V_{L1}$ 225).

Current boost circuit 217 is coupled to receive a pulse request signal $U_{PR}$ 216. Pulse request signal $U_{PR}$ 216 is a signal that indicates that an increase in current demand by the circuitry supplied by local power supply 209 is imminent. Although local power supply 209 does not itself provide the majority of the current that forms the current pulses output to a coil of a magnetic coupling, the output of such pulses can result in increased current demand by the circuitry that is supplied by local power supply 209. Pulse request signal $U_{PR}$ 216 that comes from pulse generator 114 can thus be used as a trigger by local power supply 209 to increase the output current capability of the local power supply 209 in order to assure the desired level of the supply voltage $V_{L1}$ 225 in anticipation of the imminent increased demand.

In response to the indication of imminent increased demand, current boost circuit 217 outputs a current that—along with the current output from first current amplification stage 219—is received by the second current amplification stage 221.

Second current amplification stage 221 is coupled to receive the current output from first current amplification stage 219 and current boost circuit 217, amplify them, and output a charging current $I_C$ 290. Second current amplification stage 221 is also coupled to a supply voltage (e.g., raw external voltage $V_{PCB}$ 223) during backswings to negative potentials. The second current amplification stage is configured to further provide a controlled reverse current path from $V_{L1}$ 225 to $V_{PCB}$ 223 (that is to avoid putting intrinsic body diodes of controlled switch devices in the forward direction) during this backswing of the external voltage $V_{PCB}$ 223. Second current amplification circuit 221 achieves this by providing the functionality of a switch with a controllable resistance that is controlled to the load conditions during pulse transmission.

Charging current $I_C$ 290 is output to a supply capacitor (not shown) associated with local power supply 209. This supply capacitor stores charge that powers the circuitry powered by local power supply 209. As discussed previously, the local supply voltage $V_{L1}$ 217 of local power supply 209 is more stable than the voltage supplied by the power supply that supplies the majority of the current that flows through a transmitting conductor of a magnetic coupling.

Figure 3:
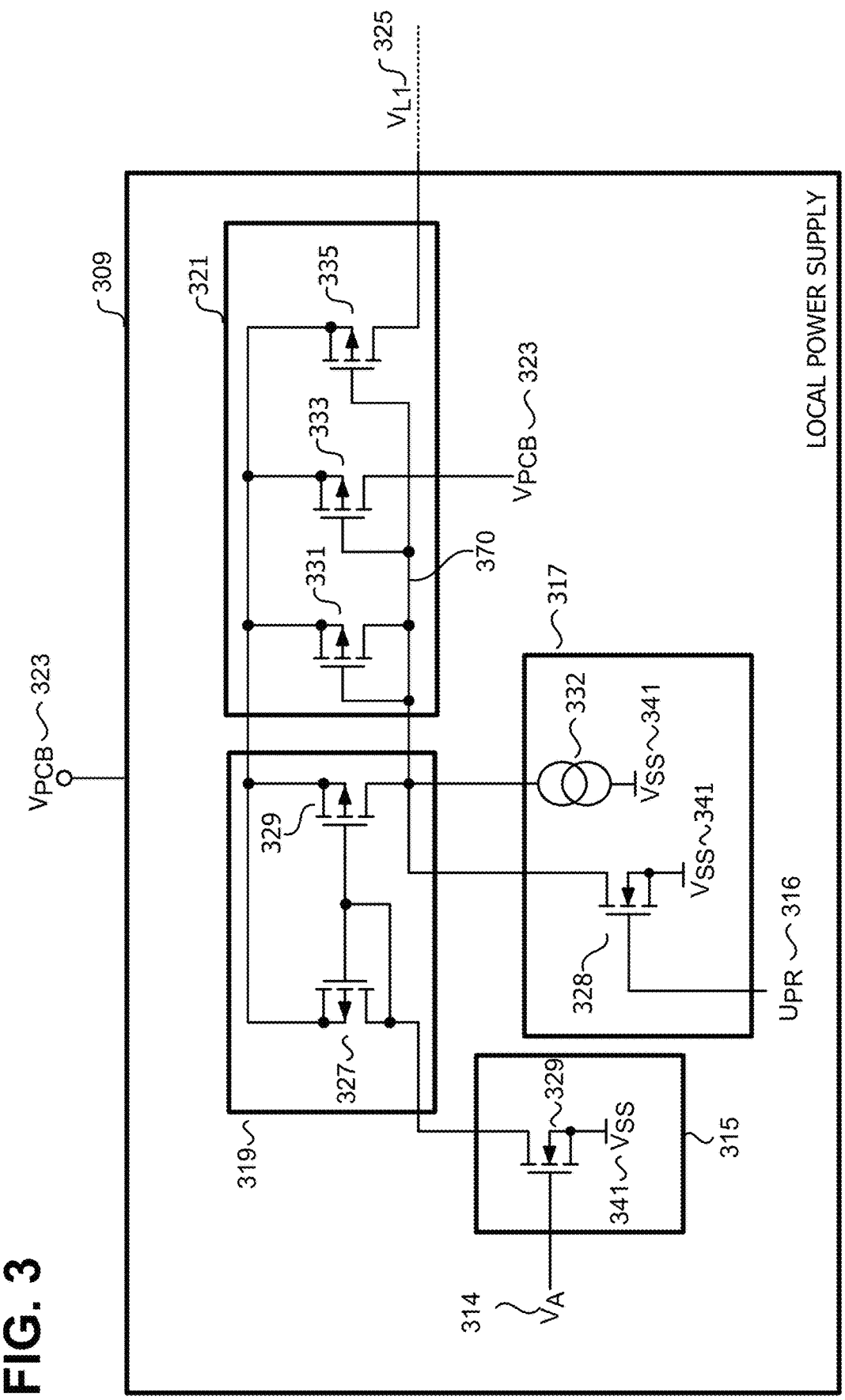
FIG. 3 further illustrates an implementation of a driver interface power supply in accordance with teachings of the present invention.

FIG. 3 further illustrates an implementation of a driver interface power supply in accordance with teachings of the present invention. The driver interface power supply could also be used as local power supply of 115 of the secondary-side drive circuit 110 if the coupling to a low voltage (e.g. 5V) raw power supply is available and the average raw voltage is close to the desired voltage.

The illustrated implementation of local power supply 309 includes a coupling to a raw external voltage $V_{PCB}$ 323, as would be the case if local power supply 309 were located on the primary side of the switch controller (i.e., if local power supply 309 were acting as local power supply 109 in the context of switch controller 102 described in FIG. 1). The illustrated implementation of local power supply 309 includes a transconductance amplification stage 315, a current boost circuit 317, a first current amplification stage 319, and a second current amplification stage 321. Transconductance amplification stage 315 includes an NMOS transistor 329 that is coupled to receive an error signal voltage $V_A$ 314 that represents the difference between the desired output and the actual output at its control terminal. The source of NMOS transistor 329 is coupled to a negative supply voltage $V_{SS}$ 341. NMOS transistor 329 operates primarily in the linear mode to conduct a current that is approximately proportional to the magnitude of error signal voltage $V_A$ 214. This current is output from transconductance amplification stage 315 to first current amplification stage 319.

First current amplification stage 319 includes a current mirror formed from a first PMOS transistor 327 and a second PMOS transistor 329. The current that flows through first PMOS transistor 327 is essentially equal to the current output from transconductance amplification stage 315. The current that flows through second PMOS transistor 329 mirrors the current that flows through first PMOS transistor 327.

Current boost circuit 317 includes an NMOS transistor 328 and a current source 332. The control terminal of NMOS transistor 328 is coupled to receive a pulse request signal $U_{PR}$ 316 that increases the current flow through NMOS transistor 328 when the output of one or more current pulses onto a conductor of a magnetic coupling is imminent. The source of NMOS transistor 328 is coupled to a negative supply voltage $V_{SS}$ 341, whereas the drain of NMOS transistor 328 is coupled to node 370. In response to pulse request signal $U_{PR}$ 316 rising to a logic high state that indicates that output of one or more current pulses onto a conductor of a magnetic coupling is imminent, NMOS transistor 328 provides an offset current in conjunction with current source 332 to provide a boost current to the first amplification stage 319.

Second current amplification stage 321 includes a pair of PMOS transistors 331, 335 coupled in a current mirror, as well as a PMOS transistor 333. PMOS transistor 333 includes a drain coupled to raw external voltage $V_{PCB}$ 323 and a control terminal that is coupled to node 370. PMOS transistors 333, 335 include body diodes that are connected in anti-series to avoid an unwanted uncontrolled (and potentially excessive) parasitic current flow through these body diodes.

Figure 4:
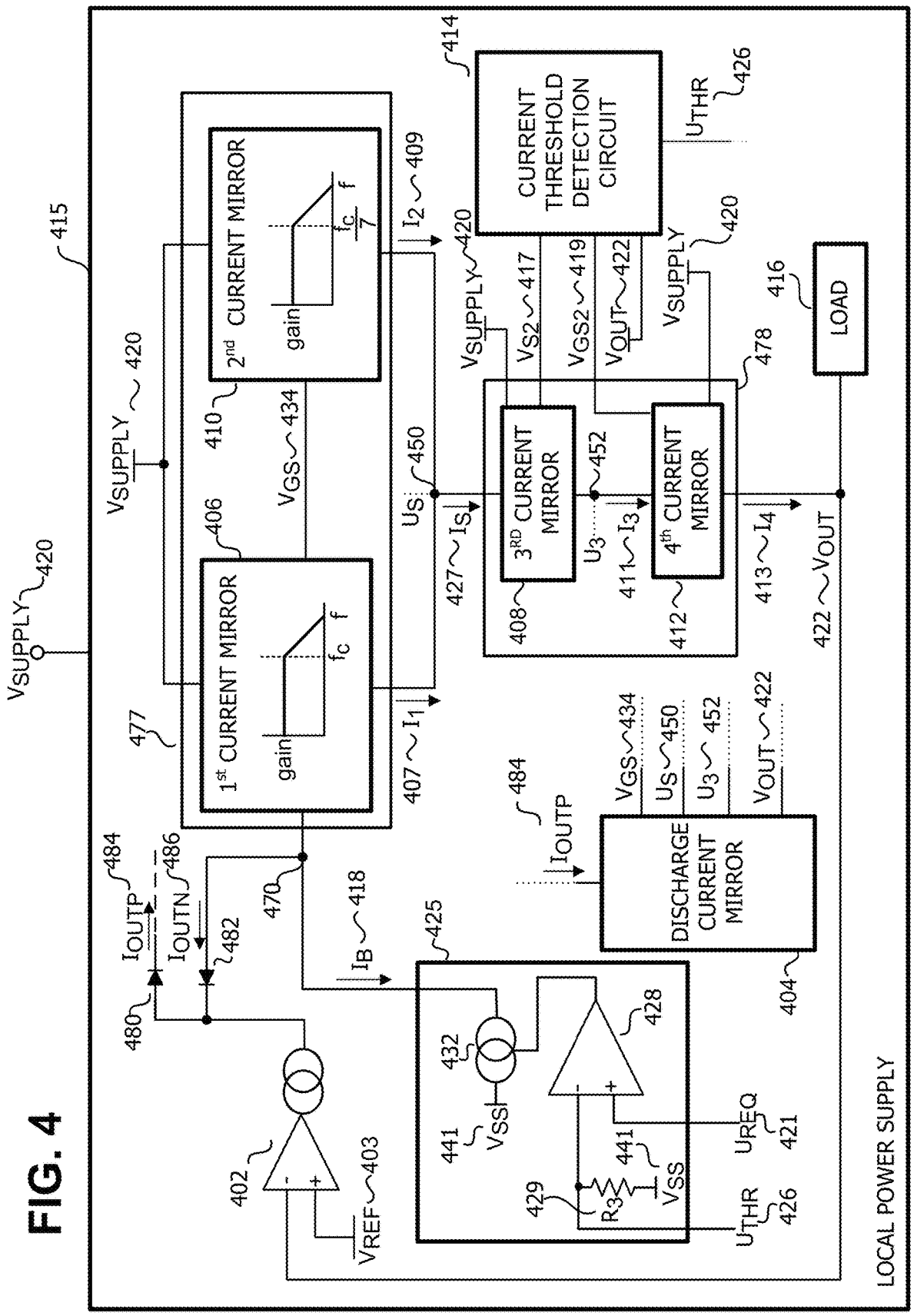
FIG. 4 illustrates one example of a drive circuit power supply in accordance with teachings of the present invention.

FIG. 4 illustrates one example of a drive circuit power supply in accordance with teachings of the present invention. Local power supply 415 can act as either of local power supply 109, 115 in the context of switch controller 102 (FIG. 1). If local power supply 415 were to be supplied with a voltage close to the desired voltage," local power supply 415 would additionally include a controlled reverse current to ensure that the other power supply (i.e., the power supply that is itself supplying local power supply 415 with power) does not reverse polarity during a swing back or otherwise.

The local power supply 415 includes a transconductance differential amplifier 402, a discharge current mirror 404, a first current amplification stage 477, a second current amplification stage 478, a current threshold detection circuit 414, and a current boost circuit 425.

Local power supply 415 is coupled to receive a supply voltage $V_{SUPPLY}$ 420. In some implementations, supply voltage $V_{SUPPLY}$ 420 may be a raw external voltage that is coupled to supply a local power supply 415 that is disposed on the secondary side of a galvanic isolation. In other implementations, supply voltage $V_{SUPPLY}$ 420 may be a supply voltage that is derived from a high voltage source, such as a regulated voltage that is powered by the voltage that is switched by the power switch of a power converter. In one case, the value of $V_{SUPPLY}$ 420 may have an average value of about 25 volts, but may range between 10.5 volts to 30 volts for controlling an IGBT. In contrast, the local power supply 415 may output a more stable, but lower average voltage. For example, local power supply 415 may have a nominal 5 volt output. As discussed above, during transmission, current pulses with relatively large and rapid changes in magnitude are desired so that a sufficient voltage is generated in the receiving conductor. Such current pulses can lead to relatively large swings in the power supply that supplies those current pulses, i.e., the same power supply that supplies supply voltage $V_{SUPPLY}$ 420. Notwithstanding those relatively large swings, local power supply 415 is able to supply a relatively more stable supply voltage to other circuitry, including, e.g., circuitry that controls the delivery of those current pulses.

Transconductance differential amplifier 402 includes an inverting input and a non-inverting input. Transconductance differential amplifier 402 is coupled to receive, at the inverting input, the supply voltage $V_{OUT}$ 422 that is output from local power supply 415 to a load 416. Transconductance differential amplifier 402 is coupled to receive a reference voltage $V_{REF}$ 403 at the non-inverting input. The output of transconductance differential amplifier 402 is coupled to diodes 480, and 482. The diodes 480,482 are for illustrative purposes only and represent that transconductance differential amplifier 402 can output either a positive output current $I_{OUTP}$ 484 or a negative output current $I_{OUTN}$ 486 in response to the output voltage $V_{-OUT}$ 422 being greater than the voltage reference $V_{REF}$ 403 or less than the voltage reference $V_{REF}$ 403.

Reference voltage $V_{REF}$ 403 is representative of the desired voltage to be supplied by local power supply 415. Transconductance differential amplifier 402 amplifies the difference between reference voltage $V_{REF}$ 403 and supply voltage $V_{OUT}$ 422. The input signal polarity of the first current mirror 406 coupled to the transconductance differential amplifier 402 is inverse to the input signal polarity of discharge current mirror 404 and determines whether current is supplied to discharge current mirror 404 or to first current amplification stage 477 in order to drive current into the load 416 if $V_{OUT}$ 422<$V_{REF}$ 403. For the implementation according to FIG. 5 and FIG. 7, the gain of the transconductance differential amplifier 402 has to be negative in order to drive the first current mirror 406 for $V_{OUT}$ 422<$V_{REF}$ 403, and to drive the discharge current mirror circuit 404 for $V_{OUT}$ 422 >$V_{REF}$ 403. If a positive current $I_{OUTP}$ 484 flows out of transconductance differential amplifier 402, this will drive a transistor within the discharge current mirror circuit 404. If a negative current $I_{OUTN}$ 486 flows out of transconductance differential amplifier 402, this will drive the first current mirror 406.

Current boost circuit 425 is also coupled to output a current to node 470, namely, a boost current $I_B$ 418. Current boost circuit 425 includes a comparator 428 and a current source 432. Comparator 428 includes an inverting input and a non-inverting input. The non-inverting input is coupled to receive a request signal $U_{REQ}$ 421 that represents if a transmission is imminent. The inverting input is coupled to receive a threshold signal $U_{THR}$ 426 that is further coupled to a load R3 429. In some cases, load R3 429 may be provided by the input resistance of a current mirror or with a MOSFET transistor operating in linear mode. Comparator 428 is coupled to receive the threshold signal $U_{THR}$ 426 that indicates that the transistors within the current mirrors are capable of delivering a minimum current to the load. The minimum current can be measured with a gate threshold voltage $V_{GS2}$ 419.

In the illustrated implementation, if threshold signal $U_{THR}$ 426 is high, this indicates the transistors have reached a minimum current capability. If threshold signal $U_{THR}$ 426 is low, the transistors are not yet at the minimum current and comparator 428 may control a current source 432 to provide a boost current $I_B$. The output current $I_{OUTN}$ 486 from transconductance differential amplifier 402 and the boost current $I_B$ 418 from current boost circuit 425 are coupled to be mirrored by both first current mirror 406 and second current mirror 410 within first current amplification stage 477.

First current mirror 406 is a current amplifier that is coupled to output a current $I_1$ 407 that is an amplified version of the current received from node 470. First current mirror 406 has a first upper cut-off frequency $f_c$ and will respond relatively quickly but insufficiently to changes in current received from node 470. Second current mirror 410 is a current amplifier that is coupled to output a current $I_2$ 409 that is an amplified version of the current received from node 470. Second current mirror 410 has a second upper cutoff frequency that is lower than the first upper cutoff frequency $f_c$ of first current mirror 406 (e.g., $1/7^{th}$ of first upper cutoff frequency $f_c$ in the illustrated implementation) and will respond relatively slowly with large amplification in current received from node 470. In control theory terms, first current mirror 406 can be thought of as a part of the proportional term whereas second current mirror 410 can be thought of providing the integral term. The sum of currents $I_1$ 407 and $I_2$ 409 is designated as $I_S$ 427 in FIG. 4.

Second current amplification stage 478 includes a third current mirror 408 and a fourth current mirror 412. Third current mirror 408 is coupled to mirror sum current $I_S$ 427 and output a resulting current signal $I_3$ 411. Third current mirror also provides a local supply voltage $V_{S2}$ 417 to the current threshold detection circuit 414. Fourth current mirror 412 is coupled to mirror third current signal $I_3$ 411 from third current mirror 408 and output a fourth current $I_4$ 413. Fourth current $I_4$ 413 is output to a supply capacitor (not shown) associated with local power supply 415. The resulting potential across the supply capacitor is output voltage $V_{OUT}$ 422. In other words, the supply capacitor stores charge that powers the circuitry powered by local power supply 415, i.e., load 416. Fourth current mirror 412 is also coupled to provide a second gate-source voltage $V_{GS2}$ 419 to current threshold detection circuit 414.

Current threshold detection circuit 414 is coupled to receive supply voltage $V_{S2}$ 417 from third current mirror 408, second gate-source voltage $V_{GS2}$ 419 from fourth current mirror 412, and output voltage $V_{OUT}$ 422. Supply voltage $V_{S2}$ 417 powers current threshold circuit 414. Current threshold detection circuit 414 is set to detect a current level that assures the local power supply 415 stays in safe operating conditions and furthermore assures the controllability of the output voltage $V_{OUT}$ 422 to the desired level. Current threshold detection circuit 414 is also coupled to output a threshold signal $U_{THR}$ 426 to the current boost circuit 425 in response to the minimum current not yet being output. Threshold signal $U_{THR}$ 426 thus indicates to the current boost circuit 425 that a current threshold has been reached.

Discharge current mirror 404 is a safety mechanism that is coupled to discharge currents from various nodes within local power supply 415 in response to output voltage $V_{OUT}$ 422 rising above the voltage reference $V_{REF}$ 403. If $V_{OUT}$ 422 is higher than desired, transconductance differential amplifier 402 outputs a positive current $I_{OUTP}$ 484. Current mirror 404 discharges various nodes within local power supply 415. In the illustrated implementation, discharge current mirror 404 is coupled to discharge—at least in part—a node of sum signal $U_S$ 450, a node of third current mirror $U_3$ 452, and $V_{OUT}$ 422. The latter reduces the voltage $V_{OUT}$ 422 directly. In other implementations, discharge current mirror 404 can be coupled to discharge different nodes, including a subset of the illustrated nodes or additional nodes, for example the node $V_{GS}$ 434, which is an internal node of the second current mirror 410.

Figure 5:
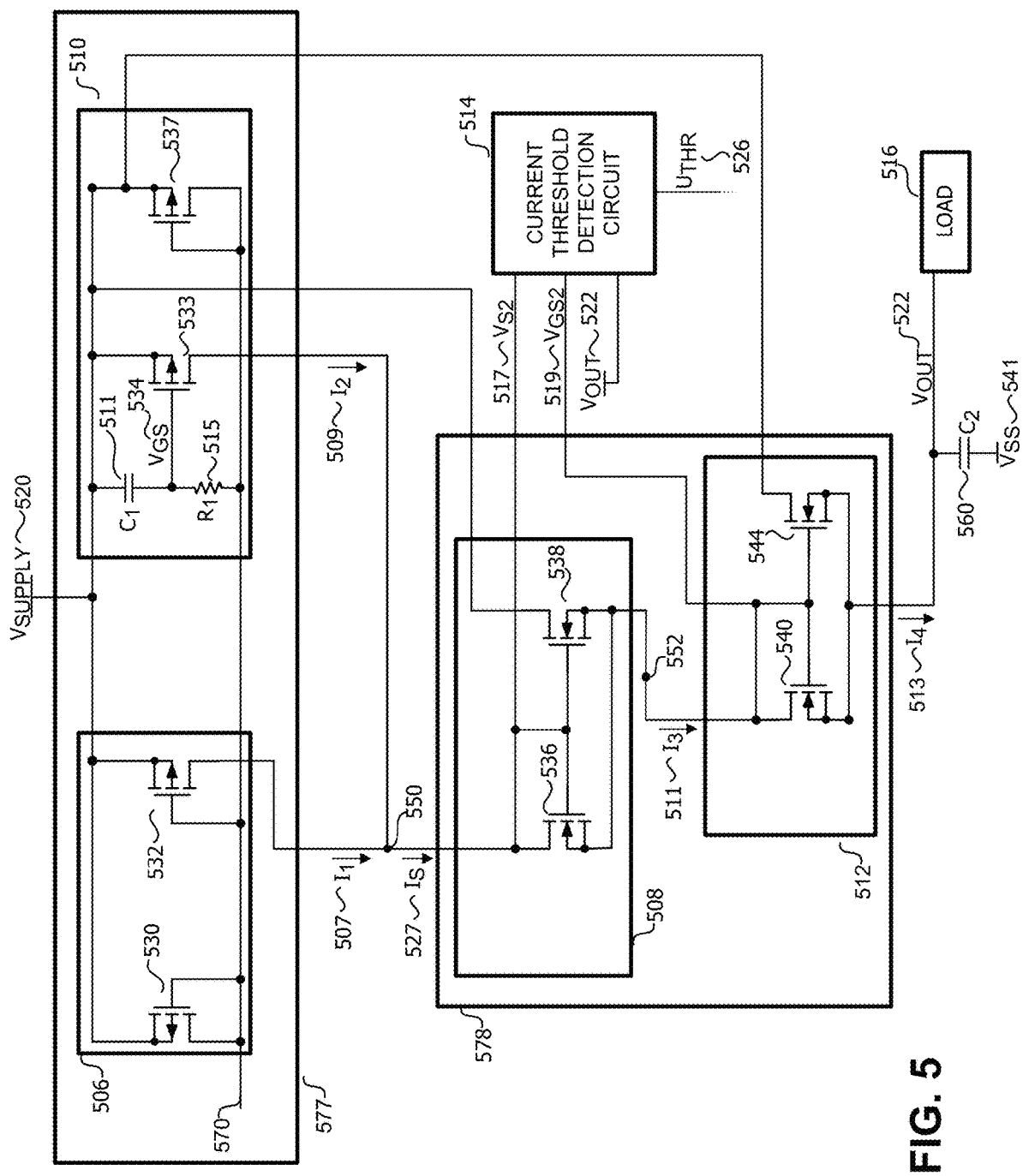
FIG. 5 further illustrates a first current mirror, second current mirror, third current mirror, and fourth current mirror of the drive circuit power supply, in accordance with teachings of the present invention.

FIG. 5 further illustrates a first current mirror 506, second current mirror 510, third current mirror 508, and fourth current mirror 512 of the drive circuit power supply, in accordance with teachings of the present invention.

First current amplification stage 577 includes both a first current mirror 506 and a second current mirror 510. First current mirror 506 includes two PMOS transistors 530 and 532 coupled in a current mirror configuration. The sources of transistor 530 and transistor 532 are coupled to the supply voltage $V_{SUPPLY}$ 520. The gates of transistors 530, 532 and drain of transistor 530 are coupled to node 570 so that the sum of a boost current (e.g., boost current $I_B$ 418) and a current that represents an error voltage (e.g., output current $I_{OUTN}$ 486) can be mirrored to provide an output current $I_1$ 507. First current mirror 506 amplifies the current to the maximum available saturation current allowed by PMOS transistor 532 such that the current remains within the safe operating area (SOA). First current mirror 506 has a first cutoff frequency $f_c$ and will respond relatively quickly with low amplification of the current received from node 570.

Second current mirror 510 includes two PMOS transistors 533, 537. For clarity purposes, transistor 537 is included to show the second output of first current mirror 506. The sources of transistor 533 and transistor 537 are coupled to the supply voltage $V_{SUPPLY}$ 520. The gate and drain of transistor 537 is coupled to node 570. The gate of transistor 533 is also coupled to an RC circuit that includes a capacitor C1 511 and a resistor R1 515 to node 570 to prevent higher frequency components from biasing the gate of transistor 533. In the illustrated implementation, this filtering circuit is implemented as an RC circuit that includes a capacitor C1 511 and a resistor R1 515. Other implementations are possible. The sum of a boost current (e.g., boost current $I_B$ 418) and a current that represents an error voltage (e.g., output current $I_{OUT}$ 405) over the frequency range can be mirrored to provide an output current $I_2$ 509.

Second current mirror 510 has a second upper cutoff frequency that is lower than the upper cutoff frequency $f_c$ of first current mirror 506, e.g., $1/7^{th}$ of the upper cutoff frequency of first current mirror 506.

Second current amplification stage 578 includes a third current mirror 508 and a fourth current mirror 512. Third current mirror 508 includes a pair of NMOS transistors 536, 538 coupled in a current mirror. The gates of NMOS transistors 536, 538 and the drain of NMOS transistor 536 are coupled to receive sum current $I_S$ 527. Sum current $I_S$ 527 is the sum of output current $I_1$ 507 from first current mirror 506 and output current $I_2$ 509 from second current mirror 510. The drain of NMOS transistor 538 is coupled to the supply voltage $V_{SUPPLY}$ 520. The sources of NMOS transistors 536, 538 are coupled together so that third current mirror 508 outputs a third current $I_3$ 507 that is approximately equal to some multiple (e.g., six times or more) of sum current Is 527. The drain of transistor 536 is coupled to provide a supply voltage $V_{S2}$ 517 to the current threshold circuit 514.

Fourth current mirror 512 includes a pair of NMOS transistors 540, 544 coupled in a current mirror. The gates of NMOS transistors 540, 544 and the drain of NMOS transistor 540 are coupled to receive third current $I_3$ 511. The drain of NMOS transistor 544 is coupled to the supply voltage $V_{SUPPLY}$ 520. The sources of NMOS transistors 540, 544 are coupled together so that fourth current mirror 512 outputs a fourth current $I_4$ 513. Fourth current $I_4$ 513 is coupled to charge a capacitor C2 560 to produce an output voltage $V_{OUT}$ 522 that is supplied to load 516. For example, $V_{OUT}$ 522 may be nominally 5 volts.

The second gate-source voltage $V_{GS2}$ 519 from fourth current mirror 412 is coupled to the current threshold circuit 514. As discussed further below, current threshold circuit 514 uses the second gate-source voltage $V_{GS2}$ 519 as an indicator of when a minimum current is available to be delivered to the load by exceeding a gate voltage threshold.

Figure 6:
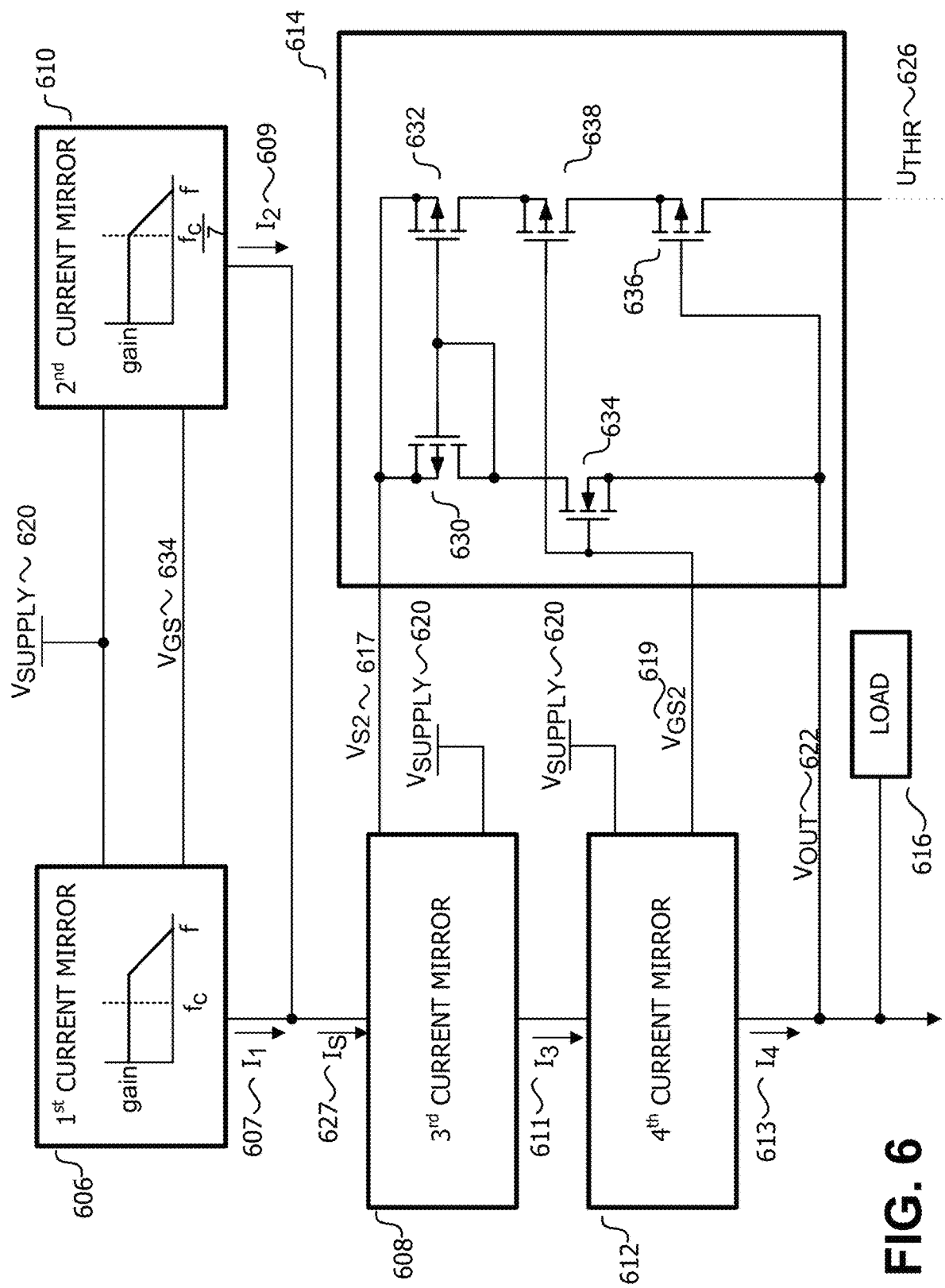
FIG. 6 further illustrates a current threshold detection circuit of the driver interface power supply, in accordance with teachings of the present invention.

FIG. 6 further illustrates a current threshold detection circuit of the driver interface power supply, in accordance with teachings of the present invention. A current threshold detection circuit 614 determines if the output current of a local power supply exceeds a threshold. For example, the threshold can represent that the largest positive departure from the desired output current which safe operation can be assured. Current threshold detection circuit 614 can act, e.g., as current threshold detection circuits 414, 514 (FIGS. 4, 5). Current threshold detection circuit 614 includes a pair of PMOS transistors 630, 632, a sense transistor 634, and cascode transistors 636, 638.

PMOS transistors 630, 632 are coupled together to form a current mirror. The sources of transistors 630, 632 are coupled together to a supply voltage. In the illustrated implementation, this supply voltage is supply voltage $V_{S2}$ 617 that is derived from the input terminal of the second current amplification stage in the local amplifier (e.g., second current amplification stage 488, 588 of FIGS. 4, 5). In other implementations, other supply voltages are possible.

The gates of transistors 630, 632 and drain of transistor 630 are all coupled to first main terminal of sense transistor 634. The drain of transistor 632 is coupled to a first main terminal of switch 638. In the illustrated implementation, control terminals of sense transistor 634, and switch 638 are coupled to second gate-source voltage $V_{GS2}$ 619 that is indicative of the voltage dropped between the gate and the source of a transistor in the fourth current mirror 612.

When the second gate-source voltage $V_{GS2}$ 619 (or other voltage in the local amplifier that is indicative of the level of the output current) is beyond a positive threshold value, then sense transistor 634 conducts. In particular, the positive gate-source voltage on the control terminal of sense transistor 634 switches it into conduction and a current conduction path that passes through PMOS transistor 630 and sense transistor 634 is formed.

The threshold signal U 626 provides a current when gate-source voltage $V_{GS2}$ 619 exceeds a gate threshold from the fourth current mirror 612. When the gate threshold is exceeded, this indicates that all the current mirrors are ready to supply current to the load. As a consequence the boost circuit from FIG. 4 will be gradually or be completely switched off.

Figure 7:
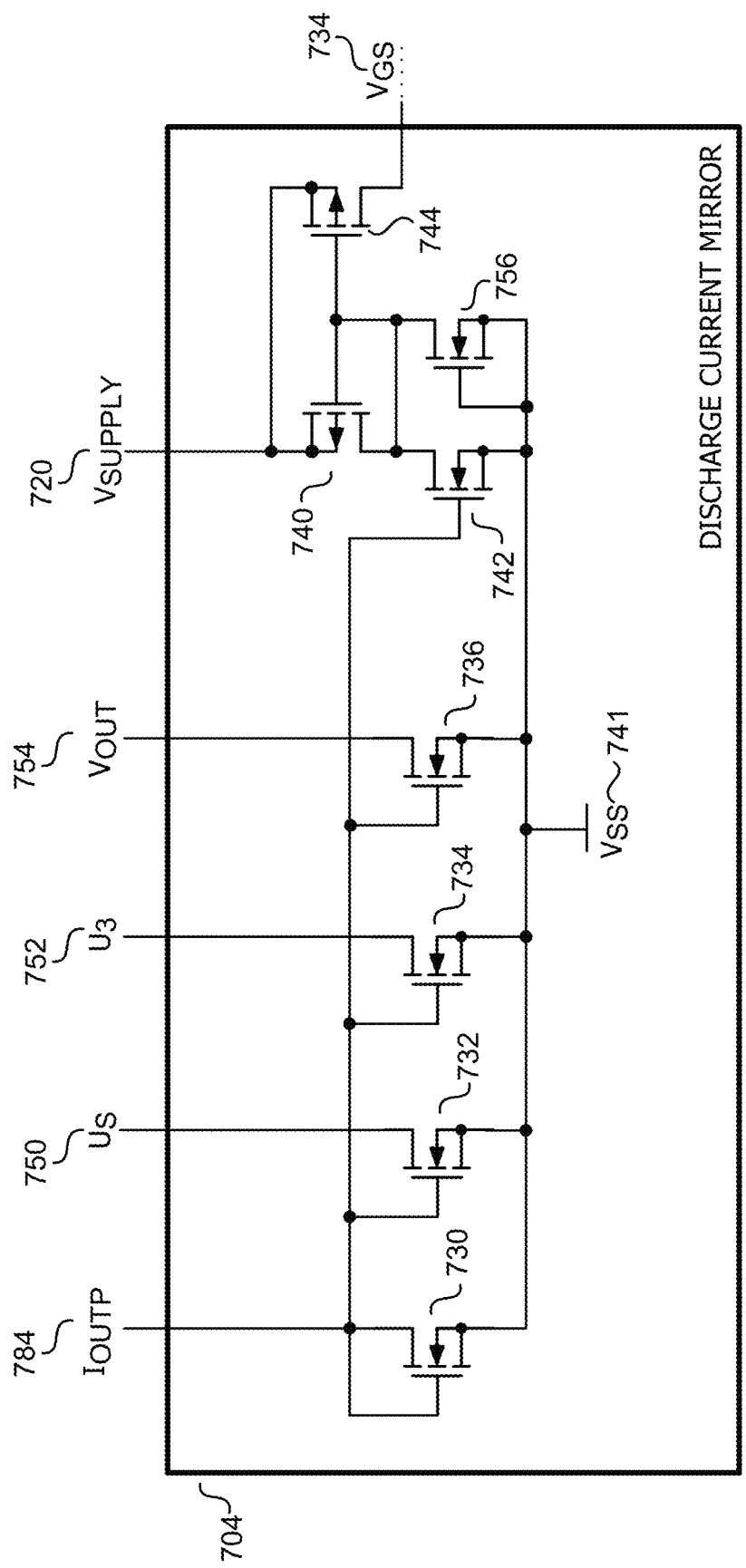
FIG. 7 further illustrates a discharge current mirror of the driver interface power supply, in accordance with teachings of the present invention.

FIG. 7 further illustrates a discharge current mirror of the driver interface power supply, in accordance with teachings of the present invention. The discharge current mirror 704 discharges a local power supply (e.g., local power supplies 109, 115, FIG. 1) in response to detection that the output voltage of the local power supply is higher than $V_{REF}$ 403.

Discharge current mirror 704 is coupled to discharge a variety of different nodes in the local power supply at the same time. By discharging multiple nodes at the same time, discharge current mirror 704 can prevent excessively large potential differences from arising in the local power supply during discharge.

The illustrated implementation of discharge current mirror 704 is coupled to receive at least a part of output current $I_{OUTP}$ 784, a sum signal $U_S$ 750, a third current mirror output signal $U_3$ 752, and an output voltage $V_{OUT}$ 754 from nodes within the local power supply. In the implementation of local power supply 415 (FIG. 4), current $I_{OUTP}$ 784 is received from the output of transconductance differential amplifier 402. Sum signal $U_S$ 750 is received from a node coupled to the output of first current amplification stage 477. Third current output signal $U_3$ 752 is received from a node that is internal to second current amplification stage 478 namely, a node disposed between third current mirror 408 and fourth current mirror 412. Output voltage signal $V_{OUT}$ 422 is received from a node coupled to the output of second current amplification stage 488. In the illustrated implementation, transistor 730 is coupled to receive a positive current $I_{OUTP}$ 784 that indicates that the output voltage of the local power supply exceeds the desired voltage. Transistor 730 controls the conduction of current by discharge transistors 732, 734, 736 to discharge different nodes in the local power supply at the same time.

Figure 8:
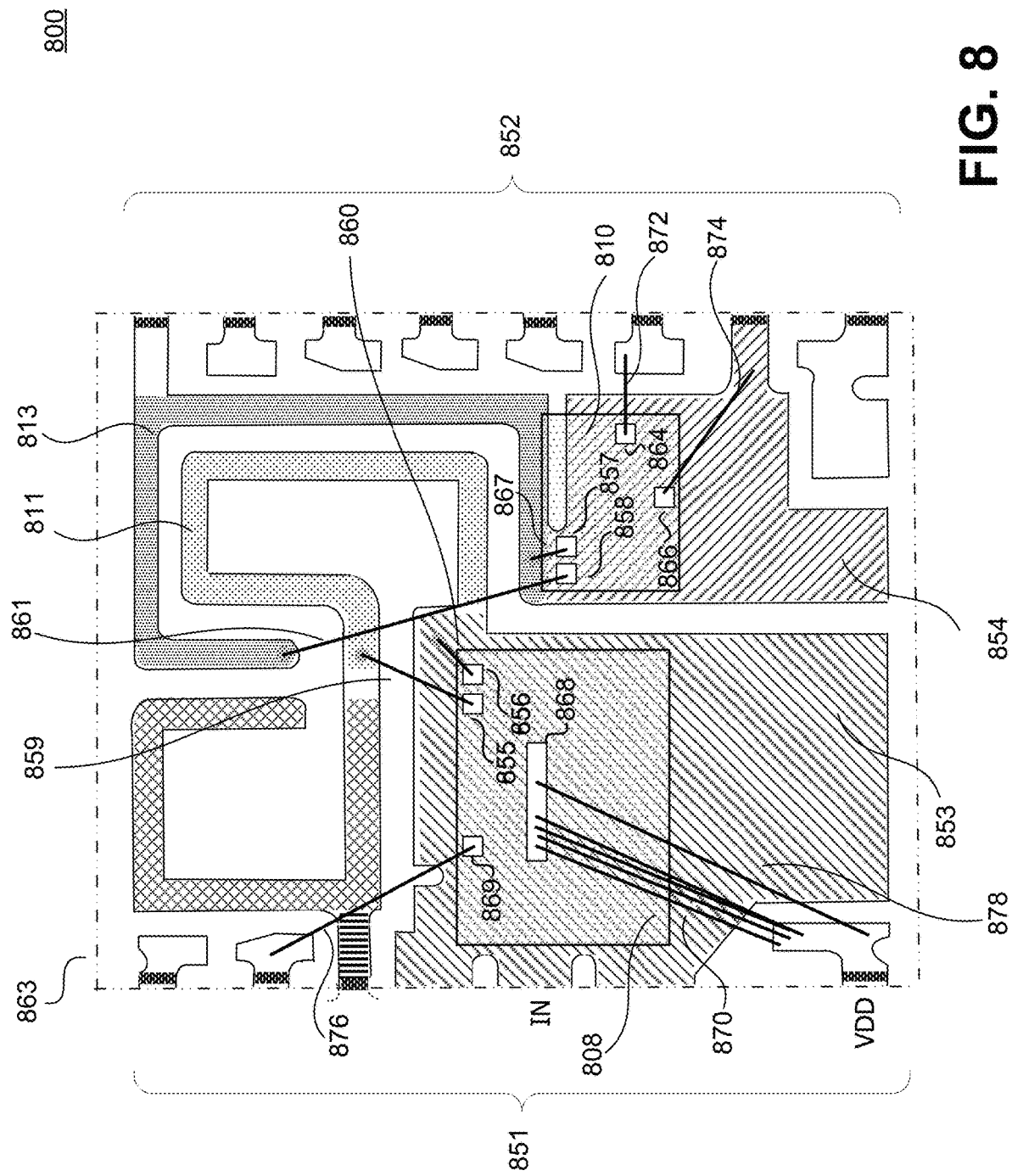
FIG. 8 is one example illustrating another example coupling between dies of within an integrated circuit package, in accordance with teachings of the present invention.

FIG. 8 is one example illustrating another example coupling between dies of within an integrated circuit package, in accordance with teachings of the present invention. In some implementations, a transmitter 808 and receiver 810 may be included on the primary side. In other implementations, both the primary and secondary side can include a transmitter 808 and receiver 810. In FIG. 8, the inductive coupling includes a transmit loop 811 and a receiver loop 813 that are defined in the lead frame 800 of the integrated circuit package.

FIG. 8 is a top down perspective of the inductive coupling. Lead frame 800 is disposed substantially within an encapsulated portion 863 of an integrated circuit package. In the illustrated implementation, the lead frame 800 includes a first conductor including the transmit loop 811 and a second conductor including the receiver loop 813. The second conductor of the lead frame is galvanically isolated from the first conductor. Transmitter conductive loop 811 is disposed proximate to the receiver conductive loop 813 to provide a magnetically coupled communication link between the transmitter conductive loop 811 and the receiver conductive loop 613. In addition, leads 851 and 852 that are coupled to a respective of die attach pad 854 and die attach pad 853. Elements within the encapsulation 863 are disposed within the encapsulated portion of the integrated circuit package. Further shown in FIG. 8 is a transmitter 808, a receiver 810, pads 855, 856, 857, 858, 864, 866, 868, 869, and bond wires 859, 860, 861, 870, 872, 874, 876, 878.

In one example, transmitter 808 and receiver 810 are implemented as circuits in integrated circuit dice included within the encapsulated portion of the integrated circuit package. Die attach pad 853, which is part of the first conductor of lead frame 800, is denoted by diagonal cross-hatching in FIG. 8 and denotes the portion of the lead frame 800 onto which transmitter 808 is mounted. Similarly, die attach pad 854, which is part of the second conductor of lead frame 800, is shaded with diagonal cross-hatching in FIG. 8 and denotes the portion of the lead frame 800 onto which the receiver 810 is mounted. In one example, the transmitter 808 and receiver 810 are attached to the respective isolated first and second conductors of the lead frame 800 utilizing an adhesive. The adhesive may be non-conductive. In another example, the adhesive may be conductive.

Leads 851 and 852 denote portions of the lead frame 800 which may couple to circuits that are external to the integrated circuit package (in other words, outside of profile 863). Although not shown, various bond wires may couple either the transmitter 808 or the receiver 810 to any of the leads 851 or 852.

The portion of lead frame 800 shaded by loosely packed dots in FIG. 8 corresponds to the transmitter conductive loop 811. The portion of lead frame 800 and bond wires 859 and 860 complete the transmitter conductive loop 811. Bond wire 859 and 860 is attached to the portion of lead frame 800 corresponding to the transmitter conductive loop 811 using wire bonding techniques. Further, the bond wire 859 is coupled to transmitter 808 through pad 855 whereas bond wire 860 is coupled to the transmitter 808 through pad 856.

The portion of the lead frame 800 shaded by densely packed dots in FIG. 8 corresponds to the receiver conductive loop 813. Bond wires 861 and 857 are attached to the portion of lead frame 800 corresponding to the receiver conduction loop 813 using wire bonding techniques. Bond wire 861 and 862 couples the portion of the lead frame 800 corresponding to the receiver conduction loop 813 to the receiver 810 via pads 858 and 857, respectively. By utilizing galvanically isolated magnetically coupled conductive loops of the lead frame to provide a communications link between the transmitter and receiver with very little cost added. In addition, utilizing the lead frame may also reduce the overall size of the switch controller and the cost of the package.

Bond wires 870 coupled to pad 868 may represent a supply voltage connection to the local power supply of the driver interface. Bond wire 872 coupled to pad 864 may represent a supply voltage connection to the local power supply of driver circuit. Bond wire 874 coupled to pad 866 may represent a local ground connection to the local power supply of driver circuit.

Figure 9:
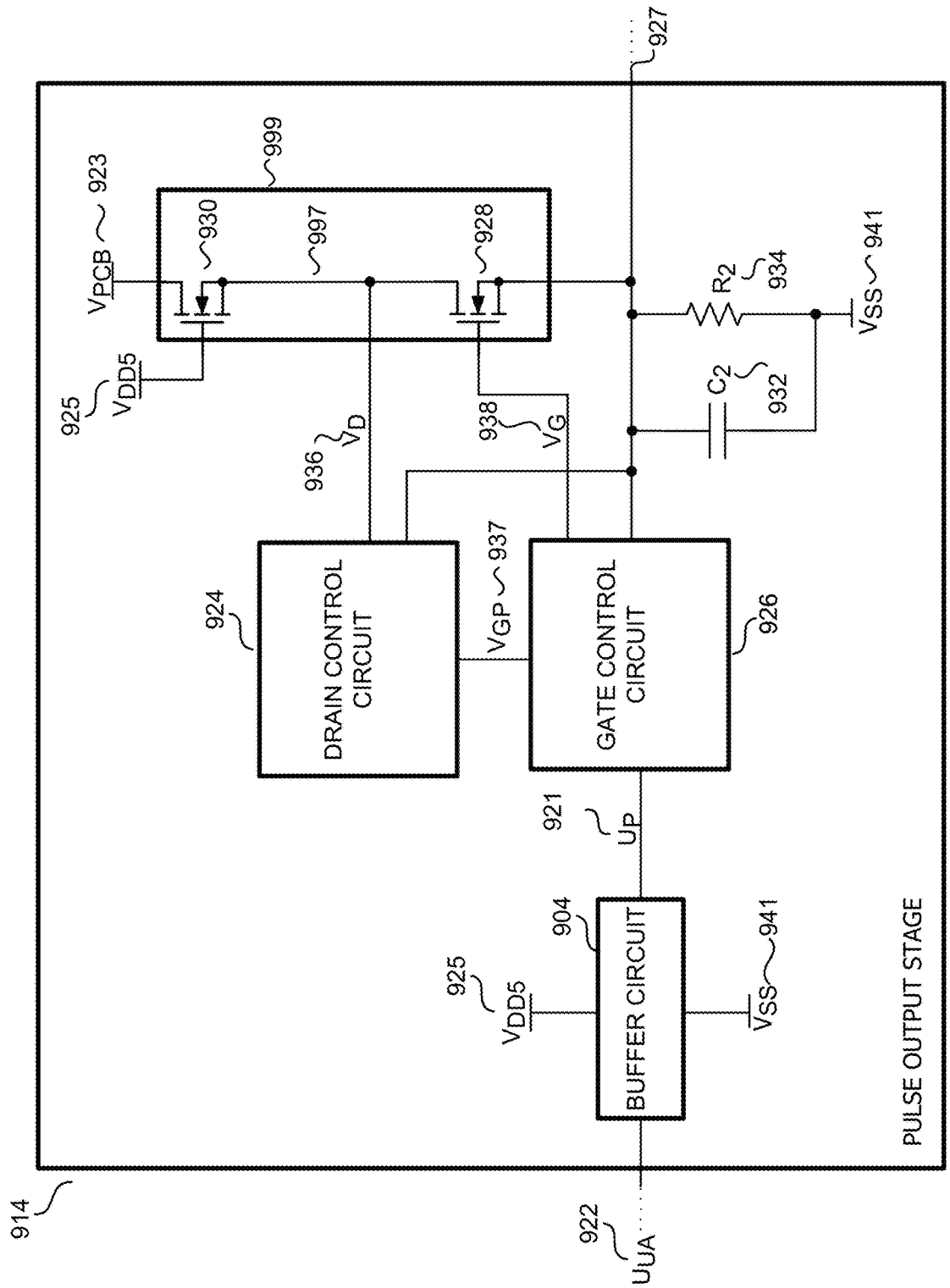
FIG. 9 is one example of a pulse output stage, in accordance with the teachings of the present invention.

FIG. 9 is one example of a pulse output stage, in accordance with the teachings of the present invention. The pulse output stage 914 outputs current pulses to a conductor of a magnetic coupling. Pulse output stage 914 can output pulses to either of a primary side conductive loop or both of a secondary side conductive loop, depending on the device. For example, pulse output stage 914 can act as pulse output stage 181 (FIG. 1).

In some implementations, the transmitting loop of the magnetic coupling has a relatively small number of turns (e.g., a single turn that includes a portion of a lead frame, a bondwire, or surface metallization). The inductance of such a loop is very small. For a given voltage step input, the current through the loop will rapidly reach a steady state and almost all of the voltage in the step will be dropped across other impedances (such as, e.g., the output resistance of the circuitry that supplies the voltage step).

However, as the current through the transmitting loop approaches a steady state, the voltage induced in the receiving loop likewise reduces to zero. Information is no longer conveyed notwithstanding the ongoing power consumption due to the steady state current flow through the transmitting loop. As discussed above, it would thus be favorable to limit the transmission signals to relatively short current pulses with a high amplitude and rapid changes. Such large, rapid changes in current flow through the transmitting coil will induce relatively large voltage signals in the receiving coil.

Pulse output stage 914 is configured to control the dissipation of the magnetically stored energy by controlling a reversal in polarity of the transmitting coil after the application of a relatively large, rapid current pulse. The magnitude of the opposite polarity can be controlled to balance the need for relatively rapid dissipation of the energy stored in the transmitting coil with the need to protect the circuitry that provides the current pulses from the opposite polarity voltage. In particular, a voltage in the opposite direction of the pulses accompanies the dissipation of the magnetic energy stored in the transmitting coil. This also induces a voltage in the receiving coil.

However, the magnitudes of the voltage generally cannot exceed a certain level. An excessively large voltage may drive some components of the circuitry that outputs the current pulses out of the safe operating conditions. For example, if the voltage drop across the transistors becomes excessively large, then the transistors may breakdown or otherwise fail.

By controlling the reversal of the polarity of transmitting coil, pulse output stage 914 is configured to ensure that the current in the transmitting coil goes down to nearly zero between pulses.

The illustrated implementation of pulse output stage 914 includes a buffer circuit 904, a drain control circuit 924, a gate control circuit 926, a current-switching stage 999, and an output terminal 927.

Current-switching stage 999 is coupled to switch the relatively large, rapid current pulses that are output over output terminal 927 and flows through the transmitting coil of a coupled inductor (not shown). The current for these pulses is drawn from a power supply that—as a result of this current draw—undergoes relatively large voltage swings due to parasitic inductances. For example, the current that flows through the transmitting coil of the coupled inductor can be drawn from an external voltage or a power supply that draws power from a coupling to a power switch in a power converter. In the illustrated implementation, the current for the relatively large, rapid current pulses is supplied by a raw external voltage $V_{PCB}$ 923.

The illustrated implementation of current-switching stage 999 includes a first transistor 928 and a second transistor 930 that are arranged in a cascode. Transistors 928, 930 are NMOS and each include a gate, a source, and a drain.

In some implementations, the substrate of transistor 928 may include a deep n-well to enable a negative voltage swing. The deep n-well structure of transistor 930 improves its transconduction. In the OFF state, transistor 930 shifts the supply voltage $V_{PCB}$ 923 down. In the ON state, a relatively large current pulse passes through transistors 930, 928 and is coupled to output terminal 927 and the transmitting coil of a coupled inductor (not shown).

The drain of transistor 930 is coupled to a relatively less stable high voltage $V_{PCB}$ 923 to draw current for the relatively large, rapid current pulses. As discussed further below, in some implementations, the voltage swings of high voltage $V_{PCB}$ 923 may be so large that high voltage $V_{PCB}$ 923 may drop below the output level of a more stable local power supply as shown in FIG. 2 or FIG. 3.

The gate of transistor 930 is coupled to a more stable supply voltage $V_{DD5}$ 925 that is supplied by such a local power supply. For example, supply voltage $V_{DD5}$ 925 can be supplied by local power supplies 109, 115 in FIG. 1. The current capability of transistor 930 will not be reduced during the downswing of $V_{PCB}$ 923.

The source of transistor 930, the drain of transistor 928, and the output of a drain control circuit 924 are coupled to node 997. As discussed further below, drain control circuit 924 is coupled to node 997 to ensure that the voltage difference between the drain and source of transistor 928 (i.e., between node 997 and output terminal 927) does not exceed the drain-to-source tolerance of transistor 928 during the reversal in the polarity of the voltage across the transmitting coil during dissipation of the magnetic field stored therein. In particular, drain control circuit 924 is coupled to allow current to flow between a higher potential node 997 and a lower potential output terminal 927. In some implementations, the drain control circuit 924 is coupled to provide a voltage $V_{GP}$ 937 to the gate control circuit 926.

The gate of transistor 928 is coupled to gate control circuit 926. Gate control circuit 926 controls the gate voltage $V_G$ 938 applied to the gate of transistor 928 while transistor is in the ON state and in the OFF state. For example, gate control circuit is coupled to lower the gate voltage $V_G$ 938 during the reversal in the polarity of the voltage across the transmitting coil during dissipation of the magnetic field stored therein. By lowering the gate voltage $V_G$ 938, it ensures that the voltage difference between the gate and source of transistor 928 (i.e., between gate voltage $V_G$ 938 and output terminal 927) does not exceed a gate-to-source tolerance of transistor 928 during the reversal in the polarity of the voltage across the transmitting coil during dissipation of the magnetic field stored therein. In some implementations, the gate control circuit 926 lowers the gate voltage $V_G$ 938 below the negative supply $V_{SS}$ 941 during the backswing to achieve short pulses.

Buffer circuit 904 receives power from supply voltage $V_{DD5}$ 925 and a negative supply voltage $V_{SS}$ 941. Supply voltage $V_{DD5}$ 925 is supplied by a local power supply, e.g., local power supplies 109, 115, 209, 415 in the respective of FIGS. 1, 2, 4.

Buffer circuit 904 outputs a signal $U_P$ 921 that is coupled to the gate control circuit 926. Signal $U_P$ 921 conveys information decoded by a decoder circuit to gate control circuit 926 for transmission to the receiving coil.

Figure 10:
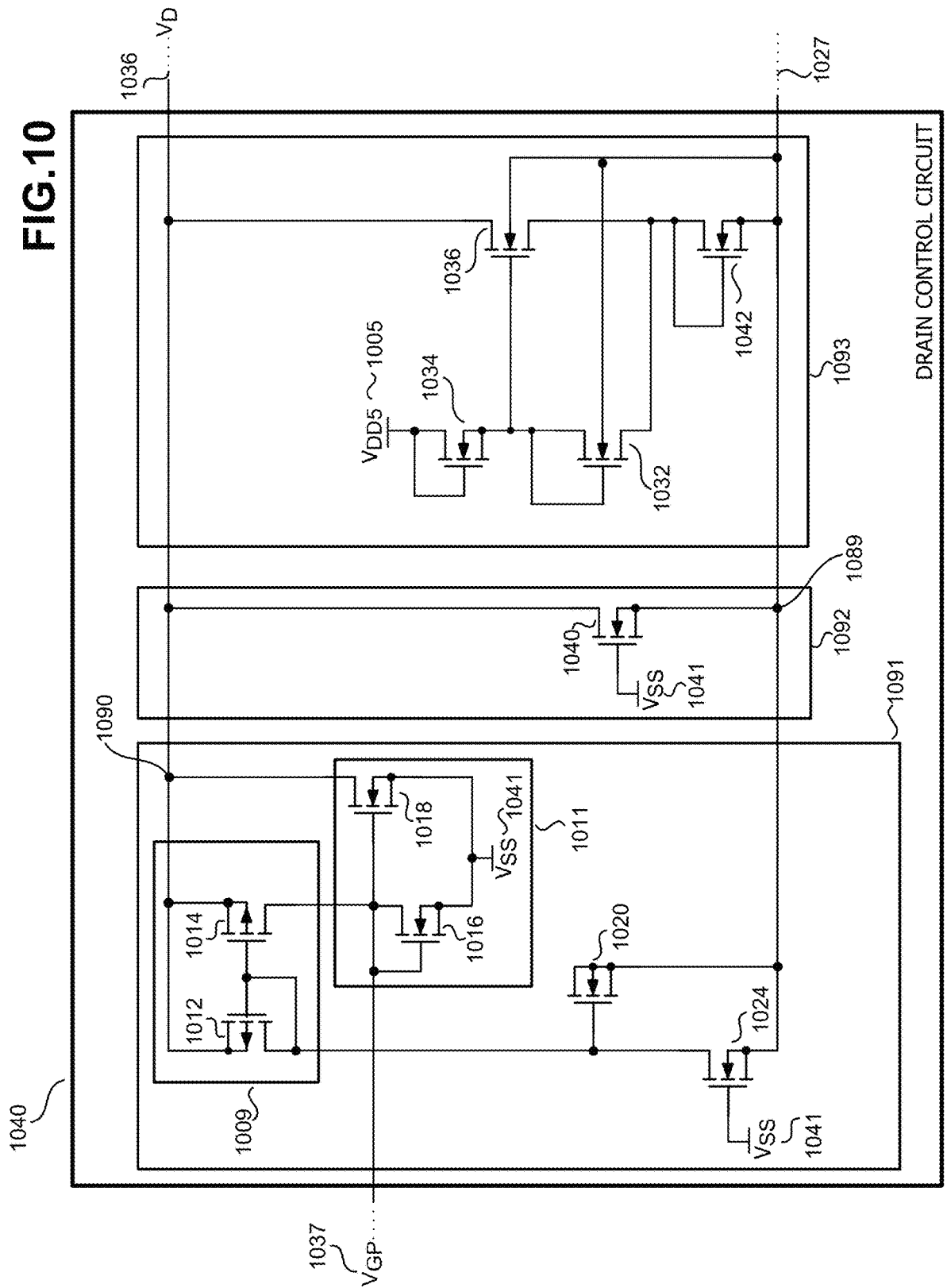
FIG. 10 further illustrates one example of the drain control circuit of the pulse output stage, in accordance with the teachings of the present invention.

FIG. 10 further illustrates one example of the drain control circuit of the pulse output stage, in accordance with the teachings of the present invention. The illustrated drain control circuit can be coupled between the drain and the source of a transistor (e.g., transistor 928 in FIG. 9) in the output stage of a transmitter that participates in the switching the relatively large current pulses that are delivered to the transmitting coil of a magnetic coupling. The drain control circuit helps ensure that the voltage difference between the drain and source of such a transistor does not exit the safe operating area during the reversal in the polarity of the voltage across the transmitting coil during dissipation of the magnetic field stored therein.

The illustrated drain control circuit 1040 includes a group of switchable current flow paths 1091, 1092, 1093 that are coupled between a pair of nodes 1090, 1089. Nodes 1090, 1089 can be coupled to the respective of the drain and source a transistor in the output stage (e.g., transistor 928 in FIG. 9). Current flow paths 1091, 1092, 1093 are configured to conduct different magnitude currents and/or switch into conduction at different times or voltages during the reversal in the polarity to control the potential difference between the drain and source of the transistor.

Current flow path 1091 includes a first current mirror 1009, a second current mirror 1011, an NMOS transistor 1024, and an NMOS transistor 1020. First current mirror 1009 includes a pair of PMOS transistors 1012, 1014. The sources of PMOS transistors 1012, 1014 are coupled to node 1090 and can be coupled to the drain of a transistor in the output stage of a transmitter. The gates of PMOS transistors 1012, 1014 and the drain of PMOS transistor 1012 are coupled together to the drain of NMOS transistor 1024 and to the gate of NMOS transistor 1020. The gate of NMOS transistor 1024 is coupled to a negative supply voltage $V_{SS}$ 1041.

Second current mirror 1011 includes a pair of NMOS transistors 1016, 1018. The sources of NMOS transistors 1016, 1018 are both coupled to negative supply voltage $V_{SS}$ 1041. The gates of NMOS transistors 1016, 1018 and the drain of NMOS transistor 1016 are all coupled together to the drain of PMOS transistor 1014. The drain of NMOS transistor 1018 is coupled to node 1090.

In operation, NMOS transistor 1024 switches into conduction as the potential of node 1089 drops sufficiently far below negative supply voltage $V_{SS}$ 1041. In the linear region of NMOS transistor 1024, the magnitude of this current is approximately equal to the potential difference between the negative supply voltage $V_{SS}$ 1041 and the potential of node 1089.

This same current is conducted through PMOS transistor 1012 and mirrored by PMOS transistor 1014. The current flow through PMOS transistor 1014 biases the gates of NMOS transistors 1016, 1018 in second current mirror 1011. The current flow through PMOS transistor 1014 and NMOS transistor 1016 is mirrored by NMOS transistor 1018 so that current flows between node 1090 and the negative supply $V_{SS}$ 1041. This current helps lowers the voltage on node 1090 as current flows through transistor 930 by increasing the voltage drop of transistor 930.

Current flow path 1092 includes an NMOS transistor 1040. NMOS transistor 1040 includes a gate, a source, and a drain. The drain of NMOS transistor 1040 is coupled to node 1090 and can be coupled to the drain of a transistor in the output stage of a transmitter. The source of NMOS transistor 1040 is coupled to node 1089 and can be coupled to the source of the same transistor. The gate of NMOS transistor 1040 is coupled to a negative supply voltage $V_{SS}$ 1041. In operation, NMOS transistor 1040 switches into conduction as the potential of node 1089 drops sufficiently far below negative supply voltage $V_{SS}$ 1041. Current flows between nodes 1090, 1089 and reduces the voltage difference between the source and drain of the transistor coupled thereto.

Current flow path 1093 includes a group of NMOS transistors 1032, 1034, 1036, 1042 that each has a gate, a source, and a drain. NMOS transistors 1032, 1034, 1042 are all diode-connected. The gate and drain of NMOS transistor 1034 are coupled to a positive supply voltage $V_{DD5}$ 1005. Positive supply voltage $V_{DD5}$ 1005 can be supplied by local power supply 115, 415 in FIG. 1 and FIG. 4. The gate and drain of NMOS transistor 1032 are coupled to the source of NMOS transistor 1034 as well as the gate of NMOS transistor 1036. The drain of NMOS transistor 1036 is coupled to node 1090. The sources of NMOS transistors 1032, 1036 are both coupled to the gate and drain of NMOS transistor 1042. The source and body of NMOS transistor 1038 are coupled to node 1089 as are the bodies of NMOS transistors 1032, 1036.

In operation, as a positive potential difference arises between the gates of NMOS transistors 1032, 1036, 1042 and their respective bodies, the channel between their respective sources and drains will increase in conductivity. For NMOS transistor 1042, this happens as the voltage on node 1089 drops below the potential set by diode-connected NMOS transistor 1032, i.e., the positive supply voltage $V_{DD5}$ 1005 minus the voltage drops across NMOS transistor 1034 and NMOS transistor 1032. As NMOS transistor 1042 switches into conduction, current will be conducted to node 1089 from both the positive supply voltage $V_{DDD5}$ 1005 and node 1090. As a result, the voltage difference between nodes 1090, 1089 (and the voltage difference between the drain the source of the transistor that conducts the current pulses to the transmitting coil) can be controlled.

In the event of a negative backswing of a pulse during signal transmission, then the voltage at 1027 falls below zero, then the gate source voltages of transistor 1040 and transistor 1024 become positive, and consequently transistor 1040 and transistor 1024 provide substantial drain currents. The drain current of transistor 1040 is directly used to sink current from node 1090. Thanks to the current sink, the voltage level at node 1090 is limited to assure that the drain source voltage of transistor 928 remains in the safe operating area.

In some implementations, the drain current of transistor 1024 sinks current from node 1090 by means of a further current amplification provided by current mirrors 1009 and 1011. In some cases, the gate-source capacitance of transistor 1020 dynamically injects current into the input of the current mirror 1009 to increase the speed the of voltage limiter function. Because transistors 1024 and 1040 have the same device structure as transistor 928, the characteristics of these devices easily match each other and the voltage limiter function can be adjusted by the ratio of the device geometries.

In some cases, current flow path 1093 provides a current in the microampere range to sink the potentially increased leakage current of the high voltage transistor 930, thereby keeping the drain/source voltage of transistor 928 within the safe operating area.

Figure 11:
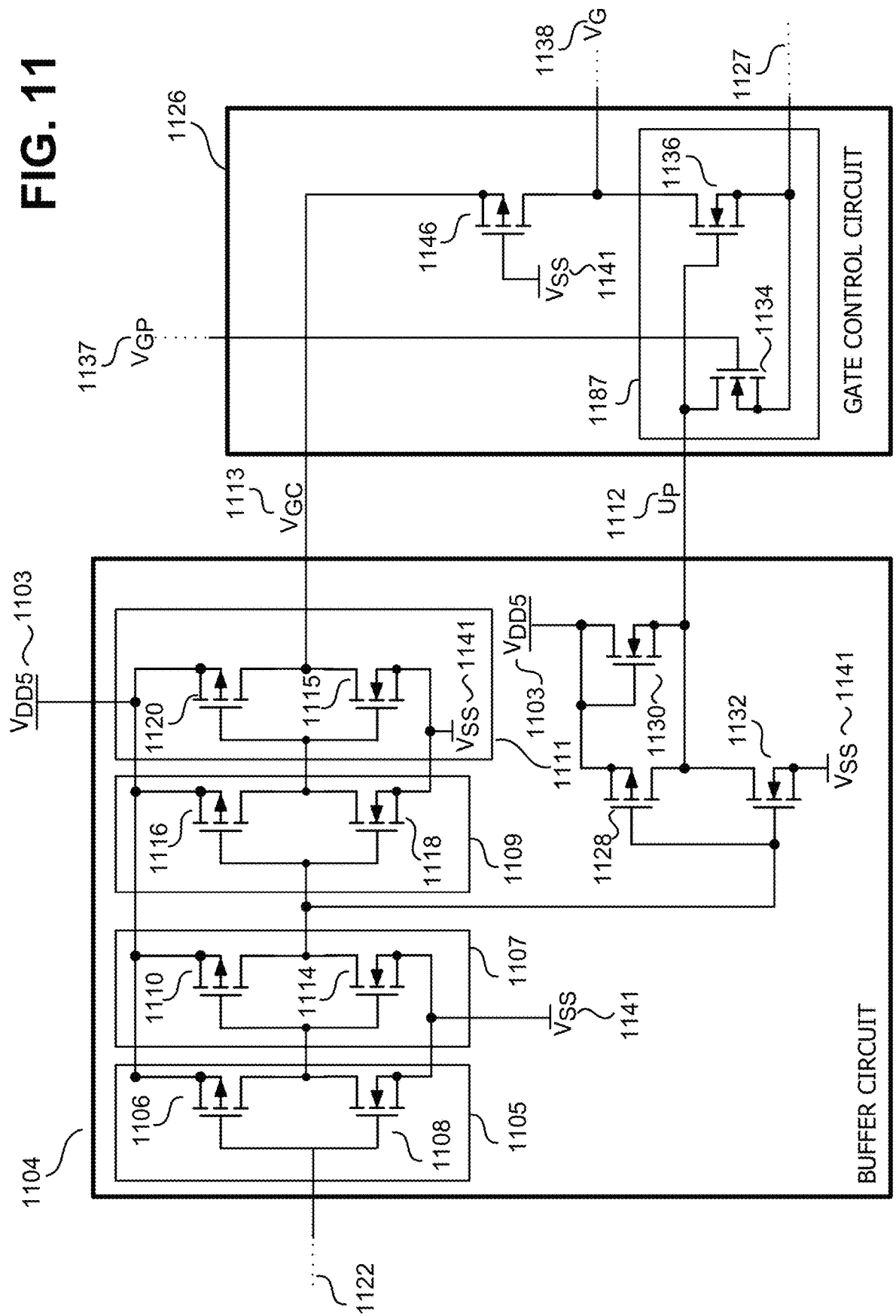
FIG. 11 further illustrates the buffer circuit and gate control circuit of the pulse output stage, in accordance with the teachings of the present invention.

FIG. 11 further illustrates the buffer circuit and gate control circuit of the pulse output stage, in accordance with the teachings of the present invention. The buffer 1104 circuit is coupled to the gate control circuit. The buffer circuit 1104 can increase the signal strength of pulse request input signal $U_{UA}$ 922 and provide a voltage $V_{GC}$ 1113 for the gate control circuit 1126.

The illustrated gate control circuit can be coupled between the gate and the source of a transistor (e.g., transistor 928 in FIG. 9) in the output stage of a transmitter that participates in the switching the relatively large current pulses that are delivered to the transmitting coil of a magnetic coupling. The gate control circuit can help ensure that the voltage difference between the gate and source of that transistor remains consistent with the desired state of the transistor (i.e., the increasing current during ON-state or decreasing current curing OFF-state) while at the same time ensuring that all of the constituents of the gate control circuit do not exit the safe operating area during the reversal in the polarity of the voltage across the transmitting coil during dissipation of the magnetic field stored therein.

Buffer circuit 1104 can increase the signal strength of the pulse request signal $U_{UA}$ 922. The buffer circuit outputs a signal Up 1112 to the gate control circuit 1126. Buffer circuit 1104 includes a first inverter 1105, a second inverter 1107, a third inverter 1109, and a fourth inverter 1111. The first, second, third, and fourth inverters are coupled to a positive supply voltage $V_{DD5}$ 1103 and a negative supply $V_{SS}$ 1141.

The second inverter 1107 also drives a fifth inverter circuit comprising of transistors 1132 and 1128 which provides an output voltage $U_P$ 112, which provides an inverse signal of pulse request input signal $U_{UUA}$ 1122. The fifth inverter circuit is coupled to a positive supply voltage $V_{DD5}$ 1103, and a negative supply voltage $V_{SS}$ 1141. The output of the fifth inverter circuit is further coupled to an NMOS transistor 1130.

Gate control circuit 1126 includes PMOS transistor 1146, and NMOS transistors 1134, 1136. Transistors 1134, 1136, 1146 each include a source, a gate and a drain. Circuitry 1126 couples and uncouples a gate control signal into the gate of the transistor that participates in the switching the relatively large current pulses to a power supply. Power for the gate control signal is provided by a power supply that is more stable that the supply which provides the relatively large current pulses that are delivered to the transmitting coil of a magnetic coupling. For example, the power for the gate control signal can be supplied by a local power supply such as, e.g., local power supplies 109, 115, 209, 415 in the respective of FIGS. 1, 2, 4. Circuitry 1187 couples and uncouples the gate of transistor 928 to allow a reversed polarity voltage across the transmitting coil during dissipation of the magnetic field stored therein.

In the illustrated implementation, gate control circuit 1126 includes a PMOS transistor 1146. PMOS transistor 1146 includes a source, a gate, and a drain. The source of PMOS transistor 1146 is coupled to a gate control signal that switches between logic high and logic low states. A logic high states indicates that a positive voltage is to be supplied to the transmitting coil of the magnetic coupling. A logic low states indicates that the supply of such a relatively large voltage is to be reduced to zero so that the energy stored in the transmitting coil can be dissipated.

Circuitry 1187 includes a pair of NMOS transistors 1134, 1136 each include a gate, source, and drain. As shown, e.g., in FIG. 9, this output is also coupled to the source of an NMOS transistor that participates in the switching of those current pulses (i.e., transistor 928 in FIG. 9).

The gate of NMOS transistor 1134 is coupled to a common gate signal $V_{GP}$ 1137. The gate of transistor 1136 is coupled to receive the controlled signal $U_P$ 1112. The controlled signal $U_P$ 1112 is coupled to transistor 1136.

In operation, if the difference between the reference potential on the gate of PMOS transistor 1146 and the potential of the gate control signal on the source of PMOS transistor 1146 remains below the threshold voltage of PMOS transistor 1146 (i.e., when the gate control signal is in a logic high state), then PMOS transistor 1146 will be in the ON state and a low impedance channel will be formed between its source and drain. This will apply the logic high level of the gate control signal to the gate of an NMOS transistor that participates in the switching the relatively large current pulses to a power supply (e.g., transistor 928 in FIG. 9), driving it into the conductive ON-state. A relatively large current pulse will be applied to the transmitting coil of the magnetic coupling.

However, if the difference between the reference potential on the gate of PMOS transistor 1146 and the potential of the gate control signal on the source of PMOS transistor 1146 rises above the threshold voltage of PMOS transistor 1146 (i.e., when the gate control signal switches into a logic low state), then PMOS transistor 1146 will transition into the OFF state and the impedance between its source and drain will increase. This will in effect end the relatively large current pulse and the polarity across the transmitting coil of the magnetic coupling will reverse.

In the illustrated implementation with positive current pulses, as the potential across the transmitting coil of the magnetic coupling reverses in polarity, the output of the pulse output stage will fall below the threshold voltage of NMOS transistor 1136 will transition into a conductive ON state. The potential on the gate of the NMOS transistor that participates in the switching the relatively large current pulses to a power supply (i.e., transistor 928 in FIG. 9) will follow the negative potential of the pulse output stage with a diode-drop offset provided by NMOS transistors 1134, 1136. Current that dissipates the magnetic field in the transmitting coil can flow through NMOS transistors 1134, 1136, 928, 930 and resistor R2 934 to the reference potential.

During signal transmission, when the pulse request input signal 1122 is at high level, a buffered signal $V_{GC}$ 1113 is passed through a PMOS transistor 1146 to the net 1138, which is the gate potential of transistor 928. Consequently transistor 928 turns-on and which results in a positive swing of transmitter output voltage (927, 1127).

During signal transmission, when the pulse request input signal $U_{UA}$ 1122 is at low level, a transition below zero (a backswing) of the transmitter output voltage 1127 will occur. During this transition, transistor 1146 provides a high impedance output. The signal Up 1112 is at high level which initially turns off transistor 1136 by providing a gate-source voltage to transistor 928 of substantially zero. The initial turn-off of transistor 928 could be provided by connecting the gate of 928 to a negative supply voltage.

For a negative output of transmitter output voltage 1127, the gate-source voltage of transistor 928 is controlled to a dedicated positive voltage level which assures that the negative level of the output voltage 1127 matches the positive going voltage level while assuring safe operation. Then, to provide a lower gate potential than a negative supply voltage $V_{SS}$ 941 for transistor 928, the source of transistor 1136 is connected to the transmitter output voltage 1127.

The negative output of transmitter output voltage 1127 also causes a sinking of drain current from transistor 1134 by a second output of the current mirror 1011 by the common gate signal $V_{GP}$ (1037, 1137). These functions are combined in this case for the sake of reduced complexity and space savings. The drain current of transistor 1134 reduces the gate source voltage of transistor 1136 and consequently the gate source voltage of the transistor 928 is increased, and thus the negative level of the transmitter output voltage 1127 is reduced accordingly.

This effect is primarily limited by transistor 1130, but also by transistor 1128. The dimensioning is according to the overall safe operating area requirements of transistor 1136. The size and the gate source voltage of transistor 1136 are key parameters to define the negative output level of transmitter output voltage 1127.

Because the involved circuitry use same basic device structures, the characteristics of these devices can be matched to each other and the gate control function can be easily adjusted.

The above description of illustrated examples of the present invention, including what is described in the Abstract, are not intended to be exhaustive or to be a limitation to the precise forms disclosed. While specific embodiments of, and examples for, the invention are described herein for illustrative purposes, various equivalent modifications are possible without departing from the broader spirit and scope of the present invention. Indeed, it is appreciated that the specific example voltages, currents, frequencies, power range values, times, etc., are provided for explanation purposes and that other values may also be employed in other embodiments and examples in accordance with the teachings of the present invention.

These modifications can be made to examples of the invention in light of the above detailed description. The terms used in the following claims should not be construed to limit the invention to the specific embodiments disclosed in the specification and the claims. Rather, the scope is to be determined entirely by the following claims, which are to be construed in accordance with established doctrines of claim interpretation. The present specification and figures are accordingly to be regarded as illustrative rather than restrictive.

For example, the invention may be implemented in accordance with one or more of the following embodiments.

Embodiment 1. Signal transmission circuitry comprising a conductive transmitting coil, a first power supply, a semiconductor switch to reversibly couple the transmitting coil to the first power supply, control circuitry to control the coupling of the transmitting coil to the first power supply by the semiconductor switch, a second power supply coupled to supply power to the control circuitry.

Embodiment 2. The signal transmission circuitry of embodiment 1, wherein the second power supply comprises a supply capacitor that stores a charge supplied by the second power supply, and a variable current source responsive to boost a current supplied to the supply capacitor in response to a request signal.

Embodiment 3. The signal transmission circuitry of any one of embodiments 1 to 2, wherein the second power supply comprises a transconductance amplifier to output a current that is responsive to a difference between an actual output voltage and a desired output voltage of the second power supply.

Embodiment 4. The signal transmission circuitry of embodiment 3, wherein the transconductance amplification stage comprises a first amplification stage comprising a first transistor driven in the linear mode by the amplified difference.

Embodiment 5. The signal transmission circuitry of any one of embodiments 1 to 4, wherein the second power supply comprises a current amplifier to amplify a current to be output by the second power supply, wherein the current amplifier comprises a current mirror having a branch supplied by the first power supply.

Embodiment 6. The signal transmission circuitry of embodiment 5, wherein the current amplifier comprises a first current mirror having a first, relatively higher upper-cutoff frequency, a second current mirror having a second, relatively lower upper-cutoff frequency, for example, wherein the second upper cut-off frequency is between 1/30th and ½ of the first upper cut-off frequency.

Embodiment 7. The signal transmission circuitry of any one of embodiments 1 to 6, wherein the second power supply comprises a threshold detection circuit to detect whether an output current of the second power supply exceeds a threshold level and output a signal indicative thereof.

Embodiment 8. The signal transmission circuitry of embodiment 7, wherein the signal transmission circuitry comprises the variable current source, and the signal indicative of the output current exceeding the threshold voltage level is operative to reduce the boosting of the current supplied by the variable current source.

Embodiment 9. The signal transmission circuitry of any one of embodiments 1 to 8, a discharge circuit coupled to discharge one or more nodes in the second power supply in response to a signal indicating that the output voltage of the second power supply exceeds a desired voltage.

Embodiment 10. The signal transmission circuitry of embodiment 9, wherein the discharge circuit is coupled to a plurality of nodes in the second power supply.

Embodiment 11. The signal transmission circuitry of any one of embodiments 9 to 10, wherein the discharge circuit comprises a current mirror having a first coupling to receive a current indicative of the output voltage of the second power supply exceeding the upper threshold voltage and a second coupling to discharge a node within the second power supply.

Embodiment 12. The signal transmission circuitry of embodiment 11, wherein an amount of the discharge of the node within the second power supply is proportional to a magnitude of the current indicative of the output voltage of the second power supply exceeding the upper threshold voltage.

Embodiment 13. The signal transmission circuitry of any one of embodiments 1 to 12, wherein the first power supply supplies the second power supply with power.

Embodiment 14. A device comprising first circuitry referenced to a first potential, the first circuitry comprising signal transmission circuitry, second circuitry referenced to a second potential and galvanically isolated from the first circuitry, the second circuitry comprising signal reception circuitry, and a magnetic coupling between the first circuitry to the second circuitry across the galvanic isolation, the magnetic coupling comprising a conductive transmitting coil and a conductive receiving coil, wherein the signal transmission circuitry comprises a first supply having a first polarity with respect to the first potential, an output stage switch coupled between the conductive transmitting coil and the first supply to switch current conduction therebetween, and control circuitry coupled to intermittently switch the output stage switch between a more conductive state and a less conductive state and thereby transmit a signal over the transmitting coil, the control circuitry further coupled to control a voltage generated by the transmitting coil in response to the output stage switch being switched from the more conductive state into the less conductive state, wherein the voltage generated by the transmitting coil has an opposite second polarity with respect to the first potential.

Embodiment 15. The device of embodiment 14, wherein the signal transmission circuitry comprises the signal transmission circuitry of any one of embodiments 1 to 13.

Embodiment 16. The device of any one of embodiments 14 to 15, wherein the control circuitry is coupled to apply an opposite polarity voltage to a control terminal of a transistor in the output stage.

Embodiment 17. The device of any one of embodiments 14 to 16, wherein the output stage comprises a first transistor and a second transistor, the first transistor is coupled between the supply voltage and the second transistor, the second transistor is coupled between the second transistor and the transmitting coil.

Embodiment 18. The device of embodiment 17, wherein the control circuitry is coupled to control a potential applied to a control terminal of the second transistor and a potential across main terminals of the second transistor.

Embodiment 19. The device of any one of embodiments 17 to 18, wherein the control circuitry comprises one or more switchable current flow paths between the main terminals of the second transistor.

Embodiment 20. The device of any one of embodiments 17 to 19, further comprising a p-channel MOSFET coupled between the control terminal of the second transistor and a second supply voltage, wherein the p-channel MOSFET conducts to couple the second supply voltage to the control terminal of the second transistor when the output stage switch is in the more conductive state and the p-channel MOSFET isolates the control terminal of the second transistor from the second supply voltage when the output stage switch is in the less conductive state.

Embodiment 21. The device of any one of embodiments 17 to 20, further comprising an n-channel MOSFET coupled between the control terminal of the second transistor and a reference voltage having a second polarity opposite the first polarity, wherein the n-channel MOSFET conducts to couple the control terminal of the second transistor to the reference voltage when the output stage switch is in the less conductive state.

Embodiment 22. The device of any one of one of embodiments 17 to 21 wherein the second transistor comprises electrical isolation disposed between a substrate of the second transistor and a bulk of an active region of the second transistor.

Embodiment 23. The device of embodiment 22, wherein the electrical isolation comprises an NMOS in deep n-well or an insulating layer of a silicon-on-insulator device.

Embodiment 24. The device of any one of embodiments 17 to 23, wherein the control circuitry comprises adjustable current circuitry coupling the potential between the first transistor and the second transistor to the voltage generated by the transmitting coil.

Embodiment 25. The device of embodiment 24, wherein the adjustable current circuitry comprises one or more current mirrors coupling the potential between the first transistor and the second transistor to the voltage generated by the transmitting coil.

Embodiment 26. The device of any one of embodiments 14 to 25, wherein the first circuitry and the second circuitry are disposed in a single semiconductor package.

Embodiment 27. The device of embodiment 26, wherein the magnetic coupling is disposed in the single semiconductor package.

Embodiment 28. The device of any one of embodiments 1 to 27, where the transmitting coil comprises one of a portion of a lead frame, an upper layer metallization of an integrated circuit, and a bond wire.

Embodiment 29. The device of any one of embodiments 1 to 28, wherein the transmitting coil has an inductance of 50 nH or less, e.g., 20 nH or less.

What is claimed is:

1. A power conversion system, comprising:
 a system controller configured to generate an input signal in response to a system input; and
 a switch controller coupled to the system controller, the switch controller configured to control a power switch, the switch controller comprising:
  a driver interface configured to receive the input signal that indicates whether the power switch should be ON or OFF, the driver interface further configured to transmit one or more current pulses across a galvanic isolation using an inductive coupling, wherein the driver interface comprises:
   a first local power supply configured to increase an output voltage of the first local power supply when a transmission of current pulses is imminent; and
   a primary side decoder circuit configured to receive the input signal and generate a pulse request signal that indicates to the first local power supply the transmission of current pulses is imminent; and
  a drive circuit configured to receive a receiver signal induced by the inductive coupling and control the power switch to an ON state or an Off state, the drive circuit comprising:
   a second local power supply;
   a decoder circuit configured to receive the receiver signal, the decoder circuit further configured to generate a decoded signal in response to the receiver signal; and
   a driver configured to receive the decoded signal, the driver further configured to output a drive signal to control the power switch to the ON or OFF state.

2. The power conversion system of claim 1, wherein the driver interface comprises a pulse output stage configured to output the current pulses in response to the input signal.

3. The power conversion system of claim 2, wherein the first local power supply comprises:
 an error amplifier configured to output an error signal representative of a difference between an output voltage of the first local power supply and a reference voltage;
 a transconductance amplification stage coupled to the error amplifier, the transconductance amplification stage configured to receive the error signal and output a current that is representative of a magnitude of the output voltage;
 a first current amplification stage configured to amplify the current that is representative of the magnitude of the output voltage;

a current boost circuit configured to receive the pulse request signal, the current boost circuit further configured to boost the current that is representative of the magnitude of the output voltage; and a second current amplification stage configured to receive the current from the first current amplification stage and the current boost circuit, the second current amplification stage further configured to amplify the current and generate a charging current.

4. The power conversion system of claim 2, wherein the pulse output stage comprises:

a buffer circuit configured to receive the pulse request signal, the buffer circuit further configured to output a signal that conveys information decoded by a decoder circuit;

a current-switching stage configured to switch a relatively large current pulse over an output terminal;

a gate control circuit coupled to the current-switching stage, the gate control circuit configured to lower a gate voltage during a reversal in a polarity of a voltage across the inductive coupling during dissipation of a magnetic field; and a drain control circuit coupled to the current-switching stage, the drain control circuit configured to allow current to flow between a higher potential node and a lower potential output terminal.

5. The power conversion system of claim 4, wherein the current-switching stage comprises:

a first transistor and a second transistor arranged in cascode, and the second transistor includes a deep n-well to enable a negative voltage swing.

6. The power conversion system of claim 4, wherein the receiver signal is induced in response to one or more current pulses through a primary side conductive loop of the inductive coupling.

7. The power conversion system of claim 1, wherein the second local power supply comprises:

a transconductance differential amplifier configured to generate an output current to an output node that is representative of a difference between a reference voltage and a supply voltage of the second local power supply;

a current boost circuit configured to receive a request signal, the current boost circuit further configured to output a boost current to the output node;

a first current amplification stage configured to receive the boost current from the output node, the first current amplification stage further configured to amplify a first current and a second current; and a second current amplification stage coupled to the first current amplification stage, the second current amplification stage configured to receive the first current and the second current and output a fourth current.

8. The power conversion system of claim 7, wherein the first current amplification stage comprises:

a first current mirror coupled to the transconductance differential amplifier, the first current mirror having an upper cutoff frequency and configured to generate the first current in response to the output current at the output node; and a second current mirror coupled to the first current mirror, the second current mirror configured to generate the second current in response to the output current at the output node, wherein the second current mirror has an upper cutoff frequency that is lower than the upper cutoff frequency of the first current mirror.

9. The power conversion system of claim 8, wherein the second current amplification stage comprises:

a third current mirror configured to output a third current signal in response to the first current and the second current; and a fourth current mirror configured to output a fourth current signal in response to the third current signal.

10. The power conversion system of claim 9, wherein the second current amplification stage is coupled to a current threshold detection circuit, the current threshold detection circuit configured to detect a current level of the second local power supply and output a threshold signal in response to a minimum current not being met.

11. The power conversion system of claim 10, wherein the third current mirror provides a local supply voltage to the current threshold detection circuit.

12. The power conversion system of claim 9, wherein the second local power supply further comprises a discharge current mirror coupled to discharge a node of sum signal, a node of the third current mirror, and the output voltage in response to the output voltage rising above a second voltage reference.

13. The power conversion system of claim 8, wherein the transconductance differential amplifier configured to output a positive current when the supply voltage is higher than the reference voltage, the transconductance differential amplifier further configured to output a negative current when the supply voltage is less than the reference voltage.

14. The power conversion system of claim 1, wherein the system input is a pulse-width modulated signal for a motor drive.

15. A switch controller, comprising:

a primary side conductive loop;

a secondary-side conductive loop, wherein the primary side conductive loop and the secondary-side conductive loop are configured to provide galvanic isolation;

a primary-side driver interface configured to control a power switch, the primary-side driver interface comprising:

a pulse generator configured to receive an input pulse signal which provides information for the power switch, the pulse generator further configured to generate a pulse request signal to the primary side conductive loop when one or more current pulses by an output stage is imminent;

a local power supply coupled to the pulse generator, the local power supply configured to receive the pulse request signal and provide power to the primary-side driver interface; and a secondary-side drive circuit, the secondary-side drive circuit comprising:

a secondary-side decoder circuit coupled to the secondary-side conductive loop, the secondary-side decoder circuit further configured to receive a receiver voltage induced in the secondary-side conductive loop and generate a decoded signal; and a driver circuit coupled to the secondary-side decoder circuit, the driver circuit further configured to provide a drive signal to the power switch in response to the decoded signal.

16. The switch controller of claim 15, wherein the local power supply comprises:

an error amplifier configured to output an error signal representative of a difference between an output voltage of the local power supply and a reference voltage;

a transconductance amplification stage coupled to the error amplifier, the transconductance amplification stage further configured to receive the error signal and output a current that is representative of a magnitude of the output voltage;

a first current amplification stage configured to amplify the current that is representative of the magnitude of the output voltage;

a current boost circuit configured to receive the pulse request signal and configured to boost the current that is representative of the magnitude of the output voltage; and a second current amplification stage configured to receive the current from the first current amplification stage and the current boost circuit, the second current amplification stage configured to amplify the current and generate a charging current.

17. The switch controller of claim 16, wherein the secondary-side drive circuit further comprises a second local power supply, the second local power supply comprising:

a transconductance differential amplifier configured to generate an output current at an output node that is representative of a difference between a reference voltage and a supply voltage of the second local power supply;

a current boost circuit configured to receive a request signal and output a boost current to the output node;

a first current amplification stage coupled to receive the boost current from the output node, the first current amplification stage configured to amplify a first current and a second current; and a second current amplification stage coupled to the first current amplification stage, the second current amplification stage configured to receive the first current and the second current and output a fourth current.

18. The switch controller of claim 17, wherein the first current amplification stage comprises:

a first current mirror coupled to the transconductance differential amplifier, the first current mirror having a first upper cutoff frequency and configured to generate the first current in response to the output current at the output node; and a second current mirror coupled to the first current mirror, the second current mirror configured to generate the second current in response to the current at the output node, wherein the second current mirror has an upper cutoff frequency that is lower than upper cutoff frequency of the first current mirror.

19. The switch controller of claim 18, wherein the transconductance amplification stage is configured to output a positive current when the supply voltage is higher than the reference voltage, the transconductance amplification stage further configured to output a negative current when the supply voltage is less than the reference voltage.

20. The switch controller of claim 17, wherein the second current amplification stage comprises:

a third current mirror configured to receive the first current and the second current and output a third current signal; and a fourth current mirror configured to receive the third current signal and output a fourth current signal.

21. The switch controller of claim 20, wherein the second current amplification stage is coupled to a current threshold detection circuit, the current threshold detection circuit further configured to detect a detect a current level of the second local power supply and output a threshold signal in response to a minimum current not being met.

22. The switch controller of claim 21, wherein the third current mirror is configured to provide a local supply voltage to the current threshold detection circuit.

23. The switch controller of claim 20, wherein the second local power supply further comprises a discharge current mirror configured to discharge a node of sum signal, a node of third current mirror, and an output voltage in response to the output voltage rising above a second voltage reference.

* * * * *